US009704862B2

(12) United States Patent
Park et al.

(10) Patent No.: US 9,704,862 B2
(45) Date of Patent: Jul. 11, 2017

(54) SEMICONDUCTOR DEVICES AND METHODS FOR MANUFACTURING THE SAME

(71) Applicants: Panjae Park, Seongnam-si (KR); Sutae Kim, Seoul (KR); Donghyun Kim, Hwaseong-si (KR); Ha-Young Kim, Seoul (KR); Jung-Ho Do, Yongin-si (KR); Sunyoung Park, Seoul (KR); Sanghoon Baek, Seoul (KR); Jaewan Choi, Suwon-si (KR)

(72) Inventors: Panjae Park, Seongnam-si (KR); Sutae Kim, Seoul (KR); Donghyun Kim, Hwaseong-si (KR); Ha-Young Kim, Seoul (KR); Jung-Ho Do, Yongin-si (KR); Sunyoung Park, Seoul (KR); Sanghoon Baek, Seoul (KR); Jaewan Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/854,358

(22) Filed: Sep. 15, 2015

(65) Prior Publication Data
US 2016/0086947 A1   Mar. 24, 2016

Related U.S. Application Data

(60) Provisional application No. 62/052,076, filed on Sep. 18, 2014.

(30) Foreign Application Priority Data

Jan. 23, 2015  (KR) .................. 10-2015-0011322

(51) Int. Cl.
*H01L 21/70* (2006.01)
*H01L 27/092* (2006.01)
(Continued)

(52) U.S. Cl.
CPC ........ *H01L 27/092* (2013.01); *H01L 27/0207* (2013.01); *H01L 21/823871* (2013.01)

(58) Field of Classification Search
None
See application file for complete search history.

(56) References Cited

U.S. PATENT DOCUMENTS 5,661,419 A    8/1997  Bhagwan
6,423,558 B1   7/2002  Maeda et al.
(Continued)

FOREIGN PATENT DOCUMENTS

JP    11211793     8/1999
JP    3233347 B2  11/2001
(Continued)

OTHER PUBLICATIONS

U.S. Office Action dated Jan. 26, 2017 issued in co-pending U.S. Appl. No. 14/844,420.
(Continued)

*Primary Examiner* — Shaun Campbell
(74) *Attorney, Agent, or Firm* — Harness, Dickey & Pierce, P.L.C.

(57) ABSTRACT

According to example embodiments, a semiconductor device and a method for manufacturing the same are provided, the semiconductor device includes a substrate including a PMOSFET region and an NMOSFET region, a first gate electrode and a second gate electrode on the PMOSFET region, a third gate electrode and a fourth gate electrode on the NMOSFET region, and a first contact and a second contact connected to the first gate electrode and the fourth gate electrode, respectively. The first to fourth gate cut electrodes define a gate cut region that passes between the first and third gate electrodes and between the second and fourth gate electrodes. A portion of each of the first and
(Continued)

second contacts overlaps with the gate cut region when viewed from a plan view.

19 Claims, 21 Drawing Sheets

(51) Int. Cl.
H01L 27/02 (2006.01)
H01L 21/8238 (2006.01)

(56) References Cited

U.S. PATENT DOCUMENTS

| | | | |
|---|---|---|---|
| 6,469,493 | B1 | 10/2002 | Muething, Jr. et al. |
| 6,532,579 | B2 | 3/2003 | Sato et al. |
| 6,662,350 | B2 | 12/2003 | Fried et al. |
| 7,102,413 | B2 | 9/2006 | Kuroda |
| 7,547,597 | B2 | 6/2009 | Kau et al. |
| 7,685,540 | B1 | 3/2010 | Madden et al. |
| 7,917,872 | B2 | 3/2011 | Tanefusa et al. |
| 7,956,421 | B2 | 6/2011 | Becker |
| 7,960,759 | B2 | 6/2011 | Frederick et al. |
| 8,102,018 | B2 | 1/2012 | Bertin et al. |
| 8,138,783 | B2 | 3/2012 | Rius Vazquez et al. |
| 8,183,114 | B2 | 5/2012 | Tsuboi et al. |
| 8,224,604 | B1 | 7/2012 | Amrutur et al. |
| 8,239,803 | B2 | 8/2012 | Kobayashi |
| 8,258,578 | B2 | 9/2012 | Carlson |
| 8,264,044 | B2 | 9/2012 | Becker |
| 8,312,394 | B2 | 11/2012 | Ban et al. |
| 8,352,899 | B1 | 1/2013 | Yap et al. |
| 8,362,480 | B1 | 1/2013 | Hess et al. |
| 8,365,108 | B2 | 1/2013 | Baum et al. |
| 8,397,193 | B2 | 3/2013 | Ting et al. |
| 8,543,089 | B2 | 9/2013 | Chun et al. |
| 8,569,841 | B2 | 10/2013 | Becker et al. |
| 8,581,348 | B2 * | 11/2013 | Rashed ............... H01L 27/0207 257/368 |
| 8,631,382 | B2 | 1/2014 | Wang et al. |
| 8,653,630 | B2 | 2/2014 | Liaw et al. |
| 8,726,215 | B2 | 5/2014 | Lee et al. |
| 8,726,217 | B2 | 5/2014 | Gullette |
| 8,726,220 | B2 | 5/2014 | Lin et al. |
| 8,732,641 | B1 | 5/2014 | Yuh et al. |
| 8,741,763 | B2 | 6/2014 | Ma et al. |
| 8,775,977 | B2 | 7/2014 | Hsu et al. |
| 8,775,999 | B2 | 7/2014 | Chueh et al. |
| 8,782,575 | B1 | 7/2014 | Hsu et al. |
| 8,782,586 | B2 | 7/2014 | Sezginer et al. |
| 8,799,834 | B1 | 8/2014 | Chen et al. |
| 8,802,574 | B2 | 8/2014 | Yuan et al. |
| 8,853,794 | B2 | 10/2014 | Becker et al. |
| 8,878,303 | B2 | 11/2014 | Hatamian et al. |
| 8,902,094 | B1 | 12/2014 | Zhang et al. |
| 8,904,337 | B2 | 12/2014 | Yang et al. |
| 8,924,908 | B2 | 12/2014 | Kawa et al. |
| 8,946,824 | B2 | 2/2015 | Ikegami et al. |
| 8,947,912 | B2 | 2/2015 | Calhoun et al. |
| 8,987,128 | B2 | 3/2015 | Rashed et al. |
| 8,997,026 | B1 | 3/2015 | Sweis |
| 9,009,641 | B2 | 4/2015 | Becker et al. |
| 9,021,405 | B2 | 4/2015 | Hiramoto et al. |
| 9,035,393 | B2 | 5/2015 | Ma et al. |
| 9,355,910 | B2 * | 5/2016 | Rashed ............ H01L 21/823418 |
| 2001/0044918 | A1 | 11/2001 | Sato et al. |
| 2003/0016551 | A1 | 1/2003 | Takemura et al. |
| 2003/0145299 | A1 | 7/2003 | Fried et al. |
| 2003/0200493 | A1 | 10/2003 | Campbell |
| 2004/0012429 | A1 | 1/2004 | Lindberg et al. |
| 2004/0109368 | A1 | 6/2004 | Kuroda |
| 2004/0133868 | A1 | 7/2004 | Ichimiya |
| 2005/0044522 | A1 | 2/2005 | Maeda |
| 2005/0155001 | A1 | 7/2005 | Kinoshita et al. |
| 2006/0136848 | A1 | 6/2006 | Ichiryu et al. |
| 2006/0225016 | A1 | 10/2006 | Fukasawa |
| 2006/0267224 | A1 | 11/2006 | Kau et al. |
| 2007/0075718 | A1 | 4/2007 | Hess et al. |
| 2008/0216041 | A1 | 9/2008 | Wangxiao et al. |
| 2009/0037855 | A1 | 2/2009 | Tanefusa et al. |
| 2009/0091346 | A1 | 4/2009 | Chuang et al. |
| 2009/0144677 | A1 | 6/2009 | Gonzalez et al. |
| 2009/0224317 | A1 | 9/2009 | Becker |
| 2009/0315583 | A1 | 12/2009 | Rius Vazquez et al. |
| 2010/0090260 | A1 | 4/2010 | Frederick et al. |
| 2010/0093145 | A1 * | 4/2010 | Tsuboi ............... H01L 27/1104 438/275 |
| 2010/0187615 | A1 * | 7/2010 | Becker ............... H01L 27/0207 257/369 |
| 2010/0201376 | A1 | 8/2010 | Ouyang et al. |
| 2010/0252892 | A1 | 10/2010 | Becker |
| 2010/0269073 | A1 | 10/2010 | Ting et al. |
| 2011/0014786 | A1 | 1/2011 | Sezginer et al. |
| 2011/0049635 | A1 | 3/2011 | Carlson |
| 2011/0131440 | A1 | 6/2011 | Noda |
| 2011/0289467 | A1 | 11/2011 | Kobayashi |
| 2012/0137261 | A1 | 5/2012 | Ban et al. |
| 2012/0180006 | A1 | 7/2012 | Baum et al. |
| 2012/0192135 | A1 | 7/2012 | Gullette |
| 2012/0210279 | A1 | 8/2012 | Hsu et al. |
| 2012/0254817 | A1 | 10/2012 | Sherlekar |
| 2012/0278777 | A1 | 11/2012 | Lin et al. |
| 2012/0299065 | A1 | 11/2012 | Shimizu |
| 2012/0329266 | A1 | 12/2012 | Hiramoto et al. |
| 2013/0016982 | A1 | 1/2013 | Henzler |
| 2013/0021075 | A1 | 1/2013 | Felix |
| 2013/0026572 | A1 * | 1/2013 | Kawa ............... H01L 27/0207 257/347 |
| 2013/0036397 | A1 | 2/2013 | Lee et al. |
| 2013/0042216 | A1 | 2/2013 | Loh et al. |
| 2013/0086542 | A1 | 4/2013 | Teoh et al. |
| 2013/0126978 | A1 | 5/2013 | Becker et al. |
| 2013/0146982 | A1 | 6/2013 | Rashed et al. |
| 2013/0200395 | A1 | 8/2013 | Liaw et al. |
| 2013/0239077 | A1 | 9/2013 | Wang et al. |
| 2013/0242645 | A1 | 9/2013 | Calhoun et al. |
| 2013/0244427 | A1 | 9/2013 | Yuan et al. |
| 2013/0292772 | A1 | 11/2013 | Ma et al. |
| 2013/0320451 | A1 * | 12/2013 | Liu ................ H01L 29/66545 257/368 |
| 2014/0027918 | A1 * | 1/2014 | Rashed ............... G06F 17/5068 257/773 |
| 2014/0054722 | A1 | 2/2014 | Kawa et al. |
| 2014/0119099 | A1 | 5/2014 | Clark et al. |
| 2014/0130003 | A1 | 5/2014 | Cheuh et al. |
| 2014/0131816 | A1 | 5/2014 | Wang et al. |
| 2014/0137062 | A1 | 5/2014 | Yuh et al. |
| 2014/0183646 | A1 | 7/2014 | Hatamian et al. |
| 2014/0185365 | A1 | 7/2014 | Liaw |
| 2014/0189635 | A1 | 7/2014 | Yang et al. |
| 2014/0203378 | A1 | 7/2014 | Ou et al. |
| 2014/0208282 | A1 | 7/2014 | Hsu et al. |
| 2014/0210014 | A1 | 7/2014 | Ma et al. |
| 2014/0210015 | A1 | 7/2014 | Becker et al. |
| 2014/0255164 | A1 | 9/2014 | Hayes-Pankhurst et al. |
| 2014/0264894 | A1 | 9/2014 | Tien et al. |
| 2015/0143309 | A1 | 5/2015 | De Dood et al. |
| 2015/0213184 | A1 | 7/2015 | Yuan et al. |
| 2015/0287604 | A1 * | 10/2015 | Stephens .......... H01L 21/76895 438/587 |
| 2015/0370949 | A1 | 12/2015 | Moroz et al. |
| 2015/0370950 | A1 | 12/2015 | Kawa et al. |
| 2016/0025805 | A1 | 1/2016 | Uppal et al. |

FOREIGN PATENT DOCUMENTS

| | | |
|---|---|---|
| JP | 200350266 A | 2/2003 |
| JP | 2003149983 A | 5/2003 |
| JP | 2005149313 A | 6/2005 |
| JP | 2005252143 A | 9/2005 |
| JP | 2007264993 A | 10/2007 |
| JP | 2010266254 A | 11/2010 |
| JP | 2011233869 A | 11/2011 |
| JP | 5153089 B2 | 2/2013 |

(56) References Cited

FOREIGN PATENT DOCUMENTS

| | | |
|---|---|---|
| JP | 2013120852 A | 6/2013 |
| JP | 2014131063 A | 7/2014 |
| KR | 100480585 B1 | 6/2005 |
| KR | 2007109434 A | 11/2007 |
| KR | 20080045517 A | 5/2008 |
| KR | 20120125275 A | 11/2012 |
| KR | 20130067213 A | 6/2013 |
| KR | 20140012012 A | 1/2014 |
| KR | 20140043399 A | 4/2014 |

OTHER PUBLICATIONS

U.S. Office Action dated Feb. 2, 2017 issued in co-pending U.S. Appl. No. 14/844,398.
"Binary Decoder", Electronics Tutorials, pp. 1-5 (2014).
"Standard cell", Wikipedia, The Free Encyclopedia, pp. 1-5 (2013).
U.S. Appl. No. 14/843,491, filed Sep. 2, 2015.
U.S. Office Action dated Sep. 12, 2016 issued in co-pending U.S. Appl. No. 14/848,758.
Hess, et al. "Direct Probing Characterization Vehicle Test Chip for Wafer Level Exploration of Transistor Pattern on Product Chips," IEEE Conference on Microelectronic Test Structures, pp. 219-223 (2014).
U.S. Notice of Allowance dated Feb. 16, 2017 issued in co-pending U.S. Appl. No. 14/848,758.

* cited by examiner

SEMICONDUCTOR DEVICES AND METHODS FOR MANUFACTURING THE SAME

CROSS-REFERENCE TO RELATED APPLICATION

This U.S. non-provisional patent application claims priority under 35 U.S.C. §119 to U.S. Provisional Patent application Ser. No. 62/052,076, filed on Sep. 18, 2014 in the United States Patent and Trademark Office, and Korean Patent Application No. 10-2015-0011322, filed on Jan. 23, 2015 in the Korean Intellectual Property Office, the disclosures of which are hereby incorporated by reference in their entirety.

BACKGROUND

The present disclosure relates to a semiconductor devices and methods for manufacturing the same. More particularly, the inventive concepts relate to semiconductor devices including field effect transistors and methods for manufacturing the same.

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing operations of logical data, and hybrid semiconductor devices having both the function of the semiconductor memory devices and the function of the semiconductor logic devices. Semiconductor devices with excellent characteristics have been demanded with the development of the electronic industry. For example, high-reliable, high-speed and/or multi-functional semiconductor devices have been increasingly demanded. To satisfy these demands, structures of semiconductor devices have been complicated and semiconductor devices have been highly integrated.

SUMMARY

Example embodiments of inventive concepts may provide semiconductor devices capable of improving electrical characteristics and an integration density.

Example embodiments of inventive concepts may also provide methods for manufacturing a semiconductor device capable of improving electrical characteristics and an integration density.

According to example embodiments of inventive concepts, a semiconductor device may include: a substrate including a PMOSFET region and an NMOSFET region; a first gate electrode and a second gate electrode on the PMOSFET region; a third gate electrode and a fourth gate electrode on the NMOSFET region; and a first contact and a second contact connected to the first gate electrode and the fourth gate electrode, respectively. The first to fourth gate electrodes may define a gate cute region that passes between the first and third gate electrodes and between the second and fourth gate electrodes. A portion of each of the first and second contacts may overlap with the gate cut region when viewed from a plan view.

In example embodiments, the semiconductor device may further include a first connection structure and a second connection structure. The first connection structure may include the first and second contacts. The first connection structure may connect the first and fourth gate electrodes to each other. The second connection structure may connect the second and third gate electrodes to each other. The first and second contacts and second connection structure may be spaced apart from each other and may intersect each other.

In example embodiments, the first and second connection structures may intersect each other in a region between the first and second gate electrodes and between the third and fourth gate electrodes when viewed from the plan view.

In example embodiments, at least one of the first and second contacts may be in contact with a top surface and a sidewall of one end portion of the first gate electrode or the fourth gate electrode corresponding thereto.

In example embodiments, the first gate electrode may be aligned with the third gate electrode in an extending direction of the first and third gate electrodes, and the second gate electrode may be aligned with the fourth gate electrode in an extending direction of the second and fourth gate electrodes when viewed from the plan view.

In example embodiments, the semiconductor device may further include: a first device isolation layer between the PMOSFET region and the NMOSFET region. A bottom surface of at least one of the first and second contacts may be in direct contact with a top surface of the first device isolation layer at the gate cut region.

In example embodiments, the semiconductor device may further include: active portions in the PMOSFET region and the NMOSFET region. The first to fourth gate electrodes may extend in a first direction parallel to a top surface of the substrate, and the active portions may extend in a second direction intersecting the first direction. The first to fourth gate electrodes may intersect the active portions.

In example embodiments, the semiconductor device may further include second device isolation layers in the substrate between the active portions. Upper portions of the active portions may protrude above top surfaces of the second device isolation layers.

In example embodiments, the gate cut region may include a first gate cut region and a second gate cut region separated from each other. The first gate cut region may be between the first and third gate electrodes, and the second gate cut region may be between the second and fourth gate electrodes.

In example embodiments, the semiconductor device may further include: a connection contact connecting the second and third gate electrodes to each other. The connection contact may be between the first and second gate cut regions when viewed from a plan view.

In example embodiments, the semiconductor device may further include: a first device isolation layer between the PMOSFET region and the NMOSFET region; and a connection line connected to the first and second contacts. The connection line may electrically connect the first and fourth gate electrodes to each other. The connection contact may extend along a top surface of the first device isolation layer so as to be in contact with a sidewall of the second gate electrode and a sidewall of the third gate electrode, and the connection line may be over the connection contact and may intersect the connection contact.

In example embodiments, a single gate cut region may extend between the first and third gate electrodes and between the second and fourth gate electrodes.

In example embodiments, the semiconductor device may further include: an active contact connected to the first and second contacts to electrically connect the first and fourth gate electrodes to each other. The first and second contacts and the active contact may constitute a connection contact of one united body, and the connection contact may intersect the gate cut region.

In example embodiments, the semiconductor device may further include: a first device isolation layer between the PMOSFET region and the NMOSFET region. Bottom surfaces of the first and second contacts and a bottom surface of the active contact may be in direct contact with a top surface of the first device isolation layer.

In example embodiments, the semiconductor device may further include: a connection line connecting the second and third gate electrodes to each other. The connection line may be on the gate cut region to may intersect the connection contact.

According to example embodiments of inventive concepts, a semiconductor device may include a flip-flop including a PMOSFET region and an NMOSFET region, and a cross-coupling structure. The flip-flop may include a first gate electrode and a second gate electrode on the PMOSFET region, and a third gate electrode and a fourth gate electrode on the NMOSFET region. The flip flop may be configured to apply a scan enable bar signal to be applied to the first and fourth gate electrodes. The flip flop may be configured to apply a scan enable signal to the second and third gate electrodes. The cross-coupling structure may connect the first and fourth gate electrodes to each other and connect the second and third gate electrodes to each other. The cross-coupling structure may include a first contact and a second contact connected to the first gate electrode and the fourth gate electrode, respectively; a first connection structure that has the first and second contacts to electrically connect the first and fourth gate electrodes to each other; and a second connection structure that connects the second and third gate electrodes to each other. One end portion of at least one of the first and second contacts may cover both sidewalls of the first gate electrode or the fourth gate electrode corresponding thereto when viewed from a plan view.

In example embodiments, the first gate electrode may be aligned with the third gate electrode in an extending direction of the first and third gate electrodes and the second gate electrode may be aligned with the fourth gate electrode in an extending direction of the second and fourth gate electrodes when viewed from the plan view.

In example embodiments, the first and third gate electrodes may be spaced apart from each other with a first gate cut region in between, and the second and fourth gate electrodes may be spaced apart from each other with a second gate cut region in between. A portion of the first contact may overlap with the first gate cut region when viewed from the plan view, and a portion of the second contact may overlap with the second gate cut region.

In example embodiments, the first and third gate electrodes may be spaced apart from each other with a gate cut region in between, and the gate cut region may extend from between the first and third gate electrodes and between the second and fourth gate electrodes. A portion of each of the first and second contacts may overlap with the gate cut region when viewed from the plan view.

In example embodiments, the first and second contacts and second connection structure may be spaced apart from each other, and the first and second connection structures may intersect each other in a region between the first and forth gate electrodes and between the second and third gate electrodes.

According to example embodiments of inventive concepts, a method for manufacturing a semiconductor device may include: defining a PMOSFET region and an NMOSFET region in a substrate; forming a pair of gate structures on the substrate, the pair of gate structure intersecting both the PMOSFET region and the NMOSFET region; forming first, second, third, and fourth gate electrodes by patterning the pair of gate structures to form a gate cut region between the PMOSFET region and the NMOSFET region, the first and second gate electrodes being on the PMOSFET region, and the third and fourth gate electrodes being on the NMOSFET region; and forming a first contact and a second contact respectively connected to the first gate electrode and the fourth gate electrode. A portion of each of the first and second contacts may overlap with the gate cut region when viewed from a plan view.

In example embodiments, the method may further include: forming contact regions on the substrate. The forming the first contact and the second contact may include forming the first contact and the second contact in the contact regions. A portion of each of the contact regions may overlap with the gate cut region on a layout.

In example embodiments, the method may further include: forming a first connection structure including the first and second contacts, and forming a second connection structure that connects the second and third gate electrodes to each other. The first connection structure may electrically connect the first and fourth gate electrodes to each other. The first and second connection structures may intersect each other in a region between the first and forth gate electrodes and between the second and third gate electrodes when viewed from the plan view.

In example embodiments, the forming the first, second, third, and fourth gate electrodes may include forming the gate cut region by forming a first gate cut region that intersects one gate structure in the pair of gate structures and forming a second gate cut region that intersects the other gate structure in the pair of gate structures. The first gate electrode on the PMOSFET region and the third gate electrode on the NMOSFET region may be defined by the first gate cut region. The second gate electrode on the PMOSFET region and the fourth gate electrode on the NMOSFET region may be defined by the second gate cut region.

In example embodiments, a single gate cut region may extend to intersect both the pair of gate structures.

In example embodiments, forming the first to fourth gate electrodes may include: removing a portion of each of the pair of gate structures on the gate cut region; forming spacers covering sidewalls of the gate structures; forming trenches defined by the spacers; and forming a gate insulating pattern and a gate line in each of the trenches.

In example embodiments, the method may further include: forming device isolation layers in the PMOSFET region and the NMOSFET region to define active portions. The pair of gate structures may intersect the active portions.

According to example embodiments of inventive concepts, a semiconductor device includes a logic cell on a substrate. The logic cell includes first to fourth gate electrodes. The first and third gate electrode are spaced apart from each other in a first direction. The first and second gate electrode are spaced apart from each other in a second direction crossing the first direction. The fourth gate electrode is spaced apart from the third gate electrode in the second direction. The fourth gate electrode is spaced apart from the second gate electrode in the first direction. A first contact is electrically connected to the first gate electrode. The first contact extends between the first gate electrode and the third gate electrode. The first contact is spaced apart from the third gate electrode in the first direction. A second contact is electrically connected to the fourth gate electrode. The second contact extends between the second gate electrode and the fourth gate electrode. The second contact is spaced apart from the second gate electrode in the first direction.

In example embodiments, the semiconductor device may further include a first connection contact extending in the second direction. The first connection contact may connect the second gate electrode to the third gate electrode. The first connection contact may be spaced apart from the first contact in the first direction and spaced apart from the second contact in the first direction. The first connection contact may extend between the first contact and the second contact.

In example embodiments, the semiconductor device may further include a first connection line that electrically connects the first gate electrode to the fourth gate electrode. The first connection line may extend in a direction different than the first direction and the second direction from the first gate electrode to the fourth gate electrode. The first connection line may extend above the first contact and the second contact. The semiconductor device may further include a first connection contact extending in the second direction. The first connection contact may connect the second gate electrode to the third gate electrode. The first connection contact may be spaced apart from the first contact in the first direction and spaced apart from the second contact in the first direction. The first connection contact may extend between the first contact and the second contact. The first connection line may extend over the first connection contact. The first connection contact may be electrically insulated from the first gate electrode, the fourth gate electrode, and the first connection line.

In example embodiments, the substrate may include a PMOSFET region and an NMOSFET region. The substrate may define a plurality of fins in the PMOSFET region and the NMOSFET region that include sidewalls separated from each other. The first gate electrode and the second gate electrode may cross over the fins in the PMOSFET region. The third gate electrode and the fourth gate electrode may cross over the fins in the NMOSFET region.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 8A to 12A are plan views illustrating a method for manufacturing the first region of FIGS. 2 and 3;

FIGS. 8B to 12B are cross-sectional views taken along lines A-A' of FIGS. 8A to 12A, respectively;

DETAILED DESCRIPTION OF EXAMPLE EMBODIMENTS

Figure 1:
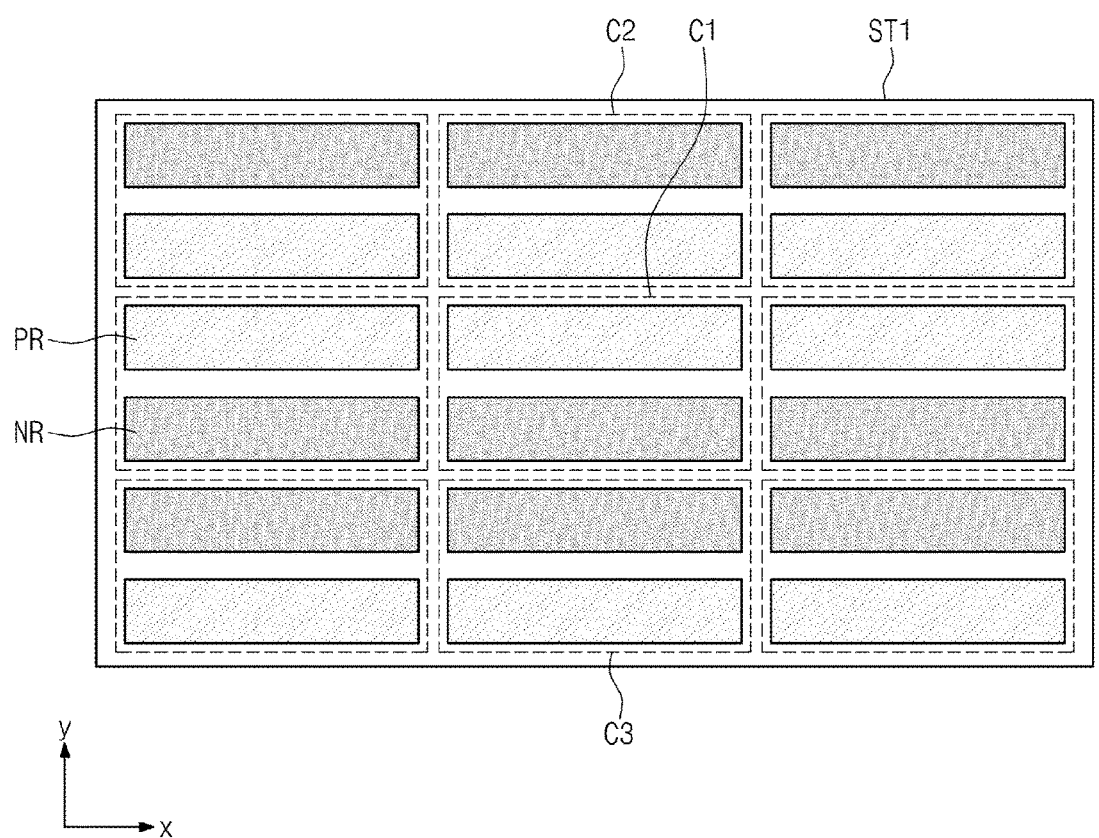
FIG. 1 is a plan view illustrating a semiconductor device according to example embodiments of inventive concepts.

Example embodiments of inventive concepts will be described in detail with reference to the accompanying drawings. Example embodiments of inventive concepts, however, may be embodied in various different forms, and should not be construed as being limited only to the illustrated embodiments. Rather, these example embodiments are provided as examples so that this disclosure will be thorough and complete, and will fully convey the scope of inventive concepts to those skilled in the art. Accordingly, known processes, elements, and techniques may not be described with respect to some example embodiments of inventive concept. Unless otherwise noted, like reference numerals denote like elements throughout the attached drawings and written description, and thus descriptions may not be repeated. In the drawings, the sizes and relative sizes of layers and regions may be exaggerated for clarity.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit example embodiments. As used herein, the singular terms "a," "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, components, regions, layers and/or sections these elements should not be limited by these terms. These terms are only used to distinguish one element, component, region, layer and/or section from another element, component, region, layer and/or section. Thus, a first element in example embodiments could be termed a second element, component, region, layer or section without departing from the teachings of example embodiments. Example embodiments of inventive concepts explained herein include their complementary counterparts. The same reference numerals or the same reference designators denote the same elements throughout the specification.

Moreover, example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
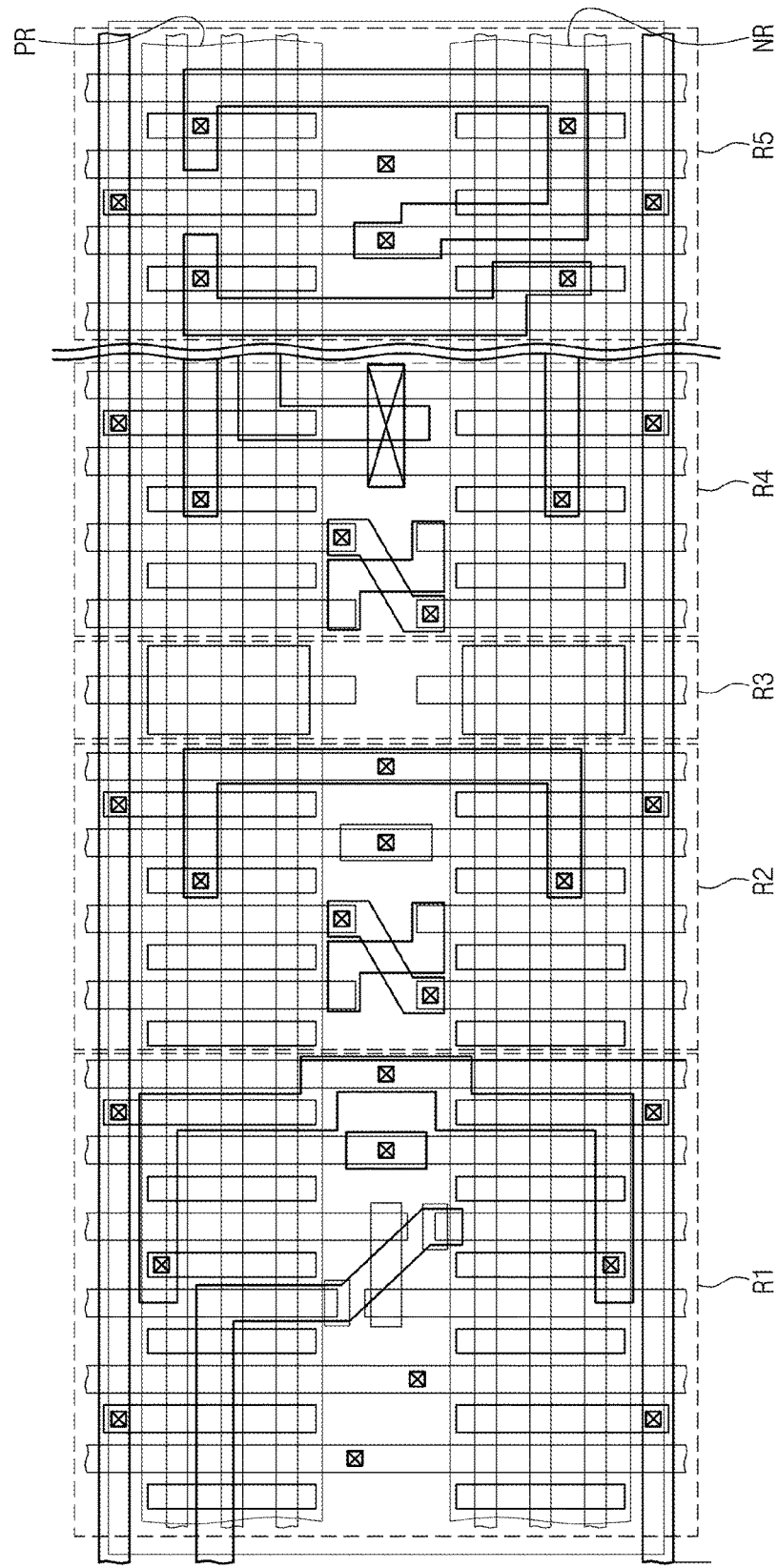
FIG. 2 is an enlarged view of a first logic cell of FIG. 1.

FIG. 1 is a plan view illustrating a semiconductor device according to example embodiments of inventive concepts. FIG. 2 is an enlarged view of a first logic cell C1 of FIG. 1.

Referring to FIGS. 1 and 2, a semiconductor device according to example embodiments of inventive concepts may include a plurality of logic cells. In the present specification, the term "logic cell" may mean a unit used to perform one logic operation. Each of the logic cells may include a plurality of transistors. In example embodiments, the semiconductor device may include a first logic cell C1, a second logic cell C2, and a third logic cell C3. The second logic cell C2 and the third logic cell C3 may be spaced apart from each other in a y-direction with the first logic cell C1 interposed therebetween. Each of the logic cells may include active regions that are isolated from each other by a first device isolation layer ST1. For example, each of the logic cells may include a PMOSFET region PR and an NMOSFET region NR. The PMOSFET region PR and the NMOSFET region NR of each of the logic cells may be isolated from each other by the first device isolation layer ST1. Hereinafter, the first logic cell C1 will be described as an example in detail. However, other logic cells may have the same structure as the first logic cell C1 or may have a structure corresponding to that of the first logic cell C1. Nine logic cells are illustrated in FIG. 1. However, inventive concepts are not limited thereto.

The first logic cell C1 may include first to fifth regions R1 to R5. The first to fourth regions R1 to R4 may constitute one flip-flop. The fifth region R5 may be connected to the flip-flop and may include a clock circuit receiving an external clock signal (CK). In more detail, the first region R1 may include a core circuit providing a scan function and a flip-flop function, and the second and fourth regions R2 and R4 may be buffer regions. The third region R3 may be a region that performs a skip function and/or a jumper function.

Hereinafter, the first to fifth regions R1 to R5 will be described in more detail.

Figure 3:
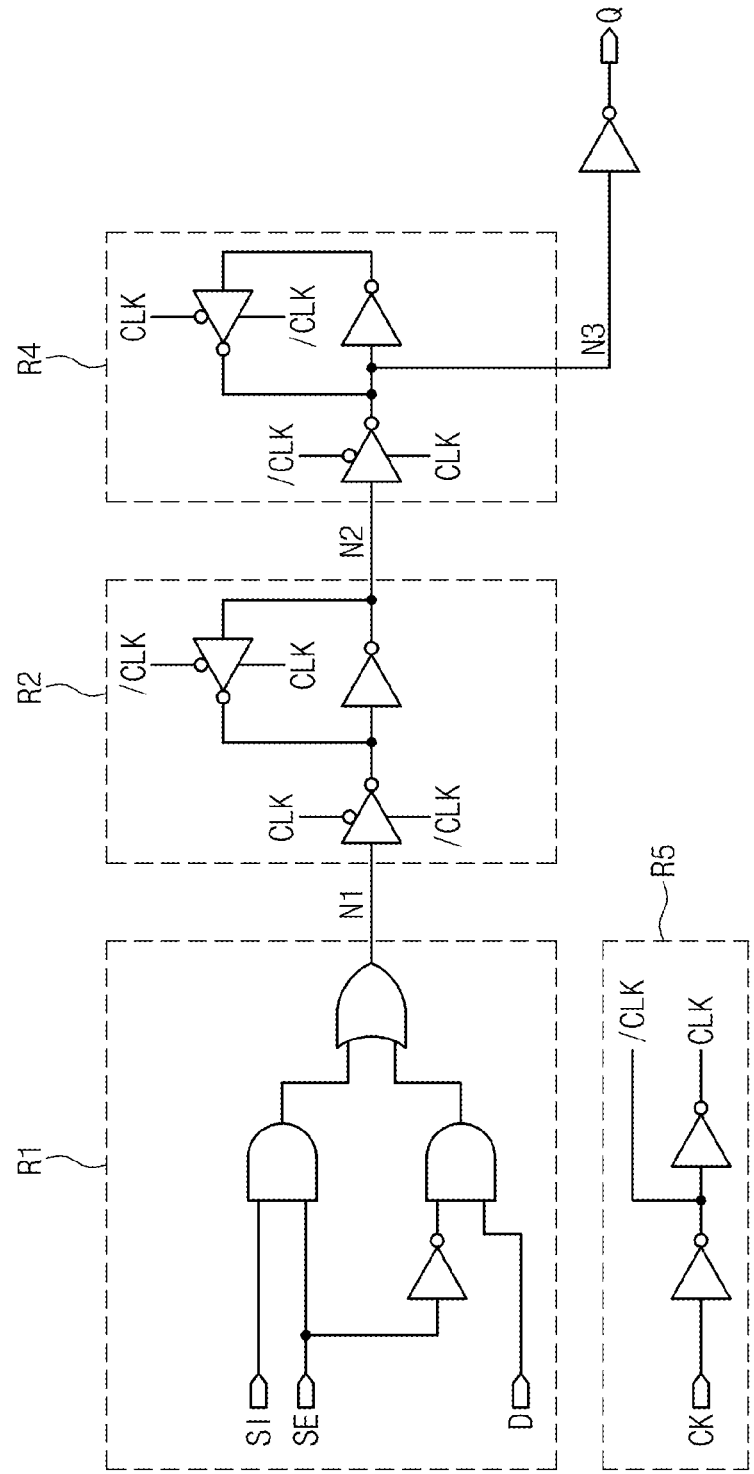
FIG. 3 is a logic circuit diagram of a flip-flop of FIG. 2.
Figure 4:
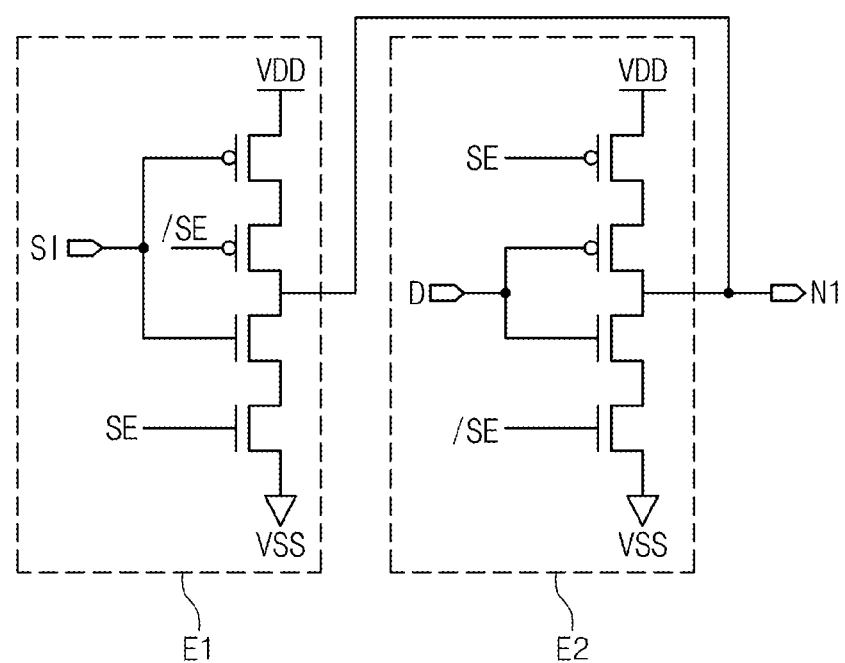
FIG. 4 is an equivalent circuit diagram of a first region of FIG. 3.
Figure 5:
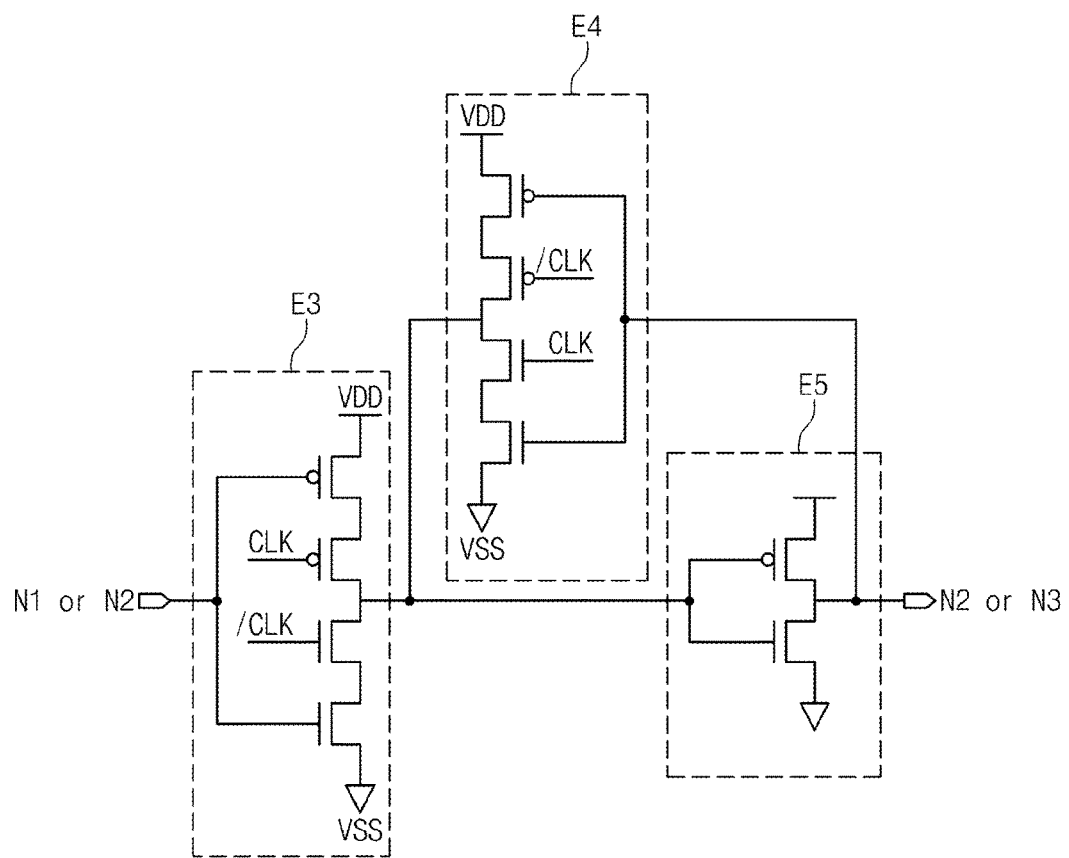
FIG. 5 is an equivalent circuit diagram of a second region or a fourth region of FIG. 3.

FIG. 3 is a logic circuit diagram of a flip-flop of FIG. 2. FIG. 4 is an equivalent circuit diagram of a first region R1 of FIG. 3. FIG. 5 is an equivalent circuit diagram of a second region R2 or a fourth region R4 of FIG. 3.

Referring to FIGS. 3 and 4, the first region R1 may include a first element E1 receiving a scan input signal SI and a second element E2 receiving an external input signal D. The first element E1 may include four transistors connected in series to each other. In other words, the first element E1 may include first to fourth transistors that are sequentially arranged from a power VDD to a ground VSS. The first and second transistors may be P-type metal-oxide-semiconductor (PMOS) transistors, and the third and fourth transistors may be N-type MOS (NMOS) transistors. The scan input signal SI may be applied to the first and third transistors. A scan enable bar signal /SE may be applied to the second transistor, and a scan enable signal SE may be applied to the fourth transistor. The second element E2 may include four transistors that are connected in series. In other words, the second element E2 may include first to fourth transistors that are sequentially connected from a power VDD to a ground VSS. The first and second transistors of the second element E2 may be PMOS transistors, and the third and fourth transistors of the second element E2 may be NMOS transistors. The external input signal D may be applied to the second and third transistors of the second element E2. The scan enable signal SE may be applied to the first transistor of the second element E2, and the scan enable bar signal /SE may be applied to the fourth transistor of the second element E2. The first element E1 and the second element E2 may be connected in parallel to a first node N1.

Referring to FIGS. 3 and 5, the second region R2 may include a third element E3, a fourth element E4, and a fifth element E5 which are connected between the first node N1 and a second node N2. A clock signal CLK and a clock bar signal /CLK may be provided to each of the third and fourth elements E3 and E4. The fourth region R4 may include the same elements as the third to fifth elements E3, E4, and E5. The third to fifth elements E3, E4, and E5 of the fourth region R4 may be connected between the second node N2 and a third node N3. Other features of the fourth region R4 except the connection between the second and third nodes N2 and N3 may be the substantially same as those of the second region R2. Hereinafter, the second region R2 will be mainly described. However, the following descriptions may also be applied to the fourth region R4.

The fourth element E4 and the fifth element E5 may be connected in parallel between the third element E3 and the second node N2. The third element E3 may include four transistors that are connected in series. In other words, the third element E3 may include first to fourth transistors that are sequentially connected from a power VDD to a ground VSS. The first and second transistors of the third element E3 may be PMOS transistors, and the third and fourth transistors of the third element E3 may be NMOS transistors. A signal transmitted through the first node N1 may be applied to the first and fourth transistors of the third element E3. The clock signal CLK may be applied to the second transistor of the third element E3, and the clock bar signal /CLK may be applied to the third transistor of the third element E3.

The fourth element E4 may include four transistors that are connected in series. In other words, the fourth element E4 may include first to fourth transistors that are sequentially connected from a power VDD to a ground VSS. The first and second transistors of the fourth element E4 may be PMOS transistors, and the third and fourth transistors of the fourth element E4 may be NMOS transistors. The first and fourth transistors of the fourth element E4 may be connected to the second node N2. The clock bar signal /CLK may be applied to the second transistor of the fourth element E4, and the clock signal CLK may be applied to the third transistor of the fourth element E4.

The following table 1 is a timing table of the flip-flop according to example embodiments of inventive concepts.

TABLE 1

| D[n] | SI | SE | CK | Q[n + 1] |
|---|---|---|---|---|
| 1 | X | 0 | Low→High | 1 |
| 0 | X | 0 | Low→High | 0 |
| X | X | X | High→Low | Q[n] |
| X | 1 | 1 | Low→High | 1 |
| X | 0 | 1 | Low→High | 0 |

If the external input signal D[n] is a logic high level and the scan enable signal SE is not activated, an external output signal Q[n+1] becomes a logic high level when the external clock signal CK is transitioned from a low level to a high level. If the external input signal D[n] is a logic low level and the scan enable signal SE is not activated, the external output signal Q[n+1] becomes a logic low level when the external clock signal CK is transitioned from the low level to the high level. If the external input signal D[n], the scan enable signal SE, and the scan input signal SI do not exist, the external output signal Q[n+1] maintains a previous cycle value Q[n] when the external clock signal CK is transitioned from the high level to the low level. If the external input signal D[n] does not exist and the scan enable signal SE and the scan input signal SI are activated, the external output signal Q[n+1] becomes a logic high level when the external clock signal CK is transitioned from the low level to the high level. In example embodiments, the external input signal D[n] may not exist, the scan enable signal SE may be activated, and the scan input signal SI may not be activated. In this case, the external output signal Q[n+1] becomes a logic low level when the external clock signal CK is transitioned from the low level to the high level.

Hereinafter, the first region R1 will be described in more detail.

Figure 6A:
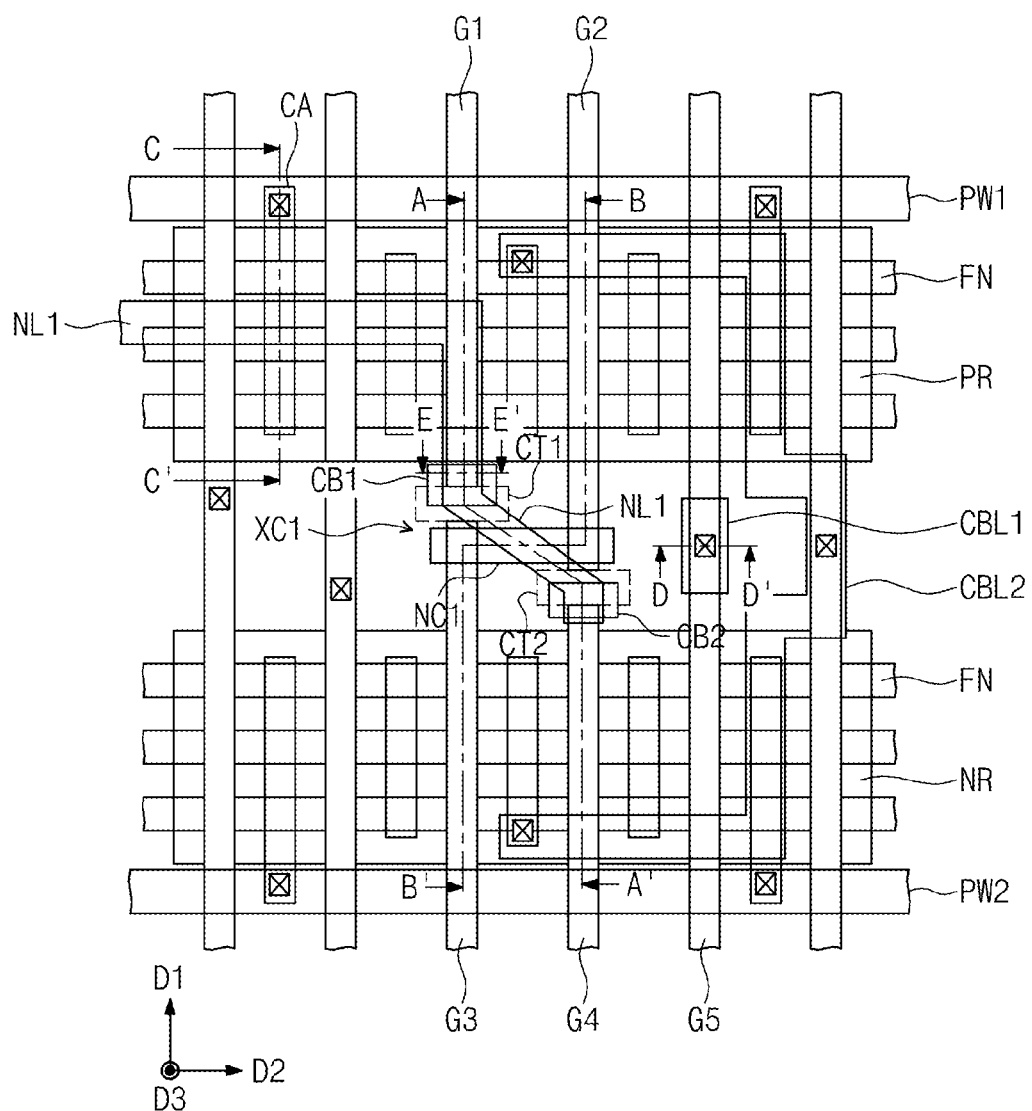
FIG. 6A is a plan view illustrating the first region of FIGS. 2 and 3.
Figure 6B:
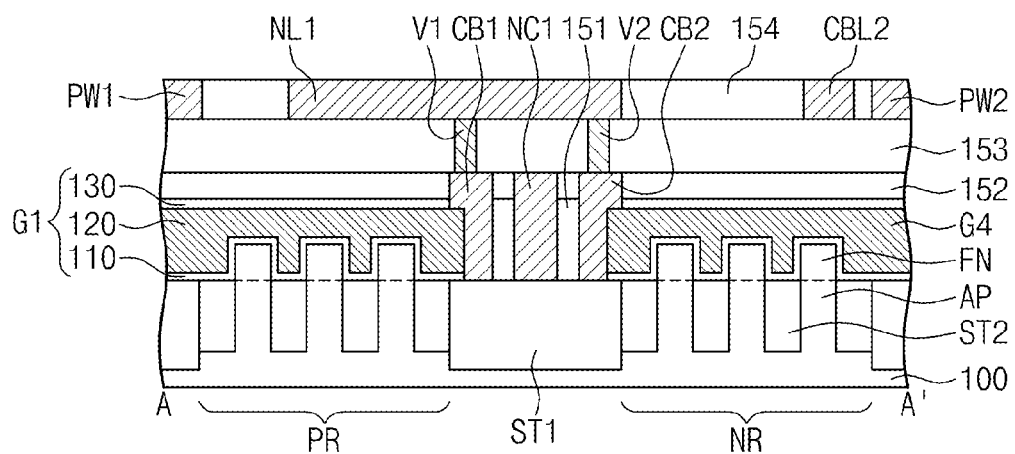
FIGS. 6B, 6C, 6D, 6E, and 6F are cross-sectional views taken along lines A-A', B-B', C-C', D-D', and E-E' of FIG. 6A, respectively.
Figure 6C:
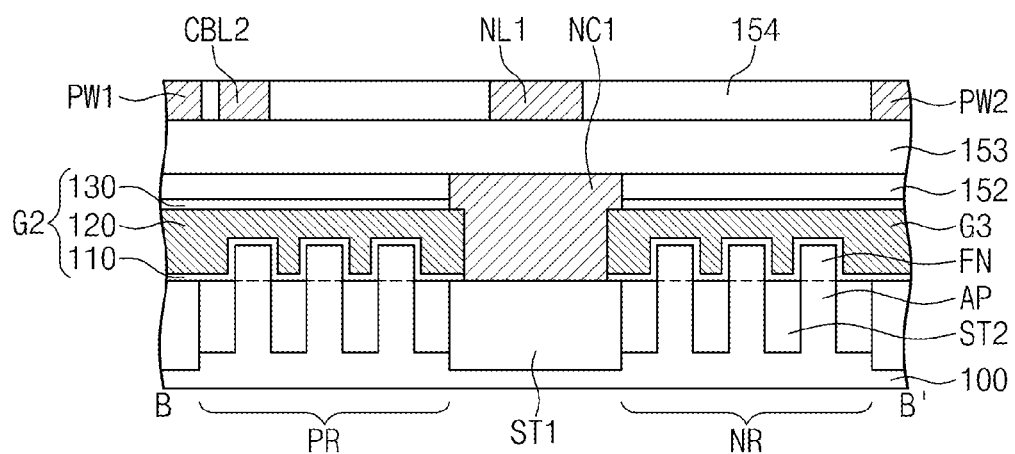
Figure 6D:
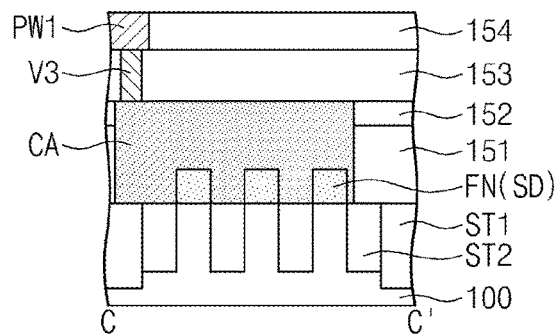

FIG. 6A is a plan view illustrating the first region of FIGS. 2 and 3. FIGS. 6B, 6C, 6D, 6E, and 6F are cross-sectional views taken along lines A-A', B-B', C-C', D-D', and E-E' of FIG. 6A, respectively.

Referring to FIGS. 6A to 6F, the first device isolation layer ST1 may be provided in a substrate 100 to define the PMOSFET region PR and the NMOSFET region NR. For example, the substrate 100 may be a silicon substrate, a germanium substrate, or a silicon-on-insulator (SOI) substrate. The PMOSFET region PR and the NMOSFET region NR may be spaced apart from each other in a first direction D1 with the first device isolation layer ST1 interposed therebetween. Each of the PMOSFET region PR and the NMOSFET region NR is illustrated as one region in FIG. 6A. Alternatively, each of the PMOSFET region PR and the NMOSFET region NR may include a plurality of regions isolated from each other by the first device isolation layer ST1.

Gate electrodes G1 to G5 extending in the first direction D1 may be provided on the substrate 100. The gate electrodes G1 to G5 may be provided in first and second interlayer insulating layers 151 and 152 sequentially stacked. Each of first to fourth gate electrodes G1 to G4 of the gate electrodes G1 to G5 may be provided on the NMOSFET region NR or the PMOSFET region PR. In example embodiments, the first and second gate electrodes G1 and G2 may be provided on the PMOSFET region PR, and the third and fourth gate electrodes G3 and G4 may be provided on the NMOSFET region NR. The first gate electrode G1 may be aligned with the third gate electrode G3 along an extending direction of the first and third gate electrode G1 and G3 (e.g., the first direction D1), and the second gate electrode G2 may be aligned with the fourth gate electrode G4 along an extending direction of the second and fourth gate electrode G2 and G4 (e.g., the first direction D1).

A first gate cut region CT1 may pass through between the first and third gate electrodes G1 and G3, and a second gate cut region CT2 may pass through between the second and fourth gate electrodes G2 and G4. In other words, the first and third gate electrodes G1 and G3 may be spaced apart from each other in the first direction D1 with the first gate cut region CT1 interposed therebetween, and the second and fourth gate electrodes G2 and G4 may be spaced apart from each other in the first direction D1 with the second gate cut region CT2 interposed therebetween. The first and second gate cut regions CT1 and CT2 may be defined on the first device isolation layer ST1 between the PMOSFET region PR and the NMOSFET region NR. The first and second gate cut regions CT1 and CT2 may not overlap with each other in a second direction D2 intersecting the first direction D1 when viewed from a plan view. In other words, the first and second gate cut regions CT1 and CT2 may be spaced apart from each other in the first direction D1 when viewed from a plan view, so a first connection contact NC1 to be described later may be disposed between the first and second gate cut regions CT1 and CT2.

In more detail, the first and third gate electrodes G1 and G3 may be formed by patterning one gate structure extending in the first direction D1. At this time, the patterning process may be performed along the first gate cut region CT1 on a layout. Likewise, the second and fourth gate electrodes G2 and G4 may be formed by patterning another gate structure extending in the first direction D1. At this time, the patterning process may be performed along the second gate cut region CT2 on a layout.

The first gate electrode G1 may be a gate electrode of the transistor which is provided with the scan enable bar signal /SE in the first element E1 described with reference to FIGS. 3 and 4. The fourth gate electrode G4 may be a gate electrode of the transistor, provided with the scan enable bar signal /SE, of the second element E2. The second gate electrode G2 may be a gate electrode of the transistor, provided with the scan enable signal SE, of the first element E1. The third gate electrode G3 may be a gate electrode of the transistor, provided with the scan enable signal SE, of the second element E2.

The fifth gate electrode G5 may extend in the first direction D1 to intersect both the PMOSFET region PR and the NMOSFET region NR.

Figure 6E:
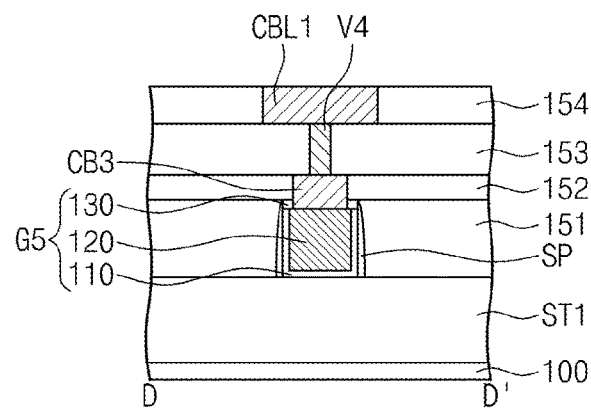

Each of the gate electrodes G1 to G5 may include a gate insulating pattern 110, a gate line 120, and a capping pattern 130 which are sequentially stacked. The gate insulating pattern 110 may include at least one of a silicon oxide layer, a silicon oxynitride layer, or a high-k dielectric layer having a dielectric constant higher than that of a silicon oxide layer. The gate line 120 may include at least one of a doped semiconductor material, a metal, or a conductive metal nitride. The capping pattern 130 may include at least one of a silicon oxide layer, a silicon nitride layer, or a silicon oxynitride layer. As illustrated in FIG. 6E, spacers SP may be provided on sidewalls of the gate electrodes G1 to G5. The spacers SP may include at least one of silicon oxide, silicon nitride, or silicon oxynitride.

A first cross-coupling structure XC1 may be provided on the first region R1. The first cross-coupling structure XC1 may connect the first gate electrode G1 to the fourth gate electrode G4 and may connect the second gate electrode G2 to the third gate electrode G3. The first cross-coupling structure XC1 may be provided on the first device isolation layer ST1 between the PMOSFET region PR and the NMOSFET region NR. The first cross-coupling structure XC1 may include a first connection structure connecting the first gate electrode G1 to the fourth gate electrode G4 and a second connection structure connecting the second gate electrode G2 to the third gate electrode G3.

The second connection structure may include a first connection contact NC1. The first connection contact NC1 may be a structure used to apply the scan enable signal SE to the second and third gate electrodes G2 and G3 at the same time. The first connection contact NC1 may have a line shape that extends along a top surface of the first device isolation layer ST1 in the second direction D2. The first connection contact NC1 may cover both one end portion of the second gate electrode G2 and one end portion of the third gate electrode G3. In other words, one end portion of the first connection contact NC1 may be in contact with a top surface and both sidewalls of the one end portion of the second gate electrode G2, and another end portion of the first connection contact NC1 may be in contact with a top surface and both sidewalls of the one end portion of the third gate electrode G3. Thus, the first connection contact NC1 may be electrically connected to the second and third gate electrodes G2 and G3. The one end portions of the second and third gate electrodes G2 and G3 may be adjacent to the second and first gate cut regions CT2 and CT1, respectively.

The first connection contact NC1 may include at least one of a metal, a conductive metal nitride, or a doped semiconductor material. In example embodiments, the first connection contact NC1 may include at least one of tungsten, titanium, tantalum, tungsten nitride, titanium nitride, or tantalum nitride.

The first connection structure may include first and second contacts CB1 and CB2, a first connection line NL1, and first and second vias V1 and V2. The first and second contacts CB1 and CB2 may be in direct contact with the first and fourth gate electrodes G1 and G4, respectively. The first connection line NL1 may electrically connect the first and fourth gate electrodes G1 and G4 to each other. The first and second vias V1 and V2 may be disposed between the first connection line NL1 and the first and second contacts CB1 and CB2, respectively. The first connection line NL1 may be a structure used to apply the scan enable bar signal /SE to the first and fourth gate electrodes G1 and G4 at the same time. The first connection line NL1 may be provided on the first connection contact NC1 and may be vertically spaced apart from the first connection contact NC1. The first connection line NL1 may extend over the first and second contacts CB1 and CB2. The first connection line NL1 may intersect the first connection contact NC1 when viewed from a plan view. In more detail, the first connection line NL1 and the first connection contact NC1 may intersect each other on the first device isolation layer ST1. The first connection contact NC1 is electrically insulated from the first gate electrode G1, the fourth gate electrode G4, and the first connection line NL1.

The first connection line NL1 may be electrically connected to the first gate electrode G1 through the first via V1 and the first contact CB1 and may be electrically connected to the fourth gate electrode G4 through the second via V2 and the second contact CB2. The first and second contacts CB1 and CB2 may be provided in the first and second interlayer insulating layer 151 and 152, and the first and second vias V1 and V2 may be provided in a third interlayer insulating layer 153 disposed on the second interlayer insulating layer 152. The first connection line NL1 may be provided in a fourth interlayer insulating layer 154 disposed on the third interlayer insulating layer 153.

Figure 6F:
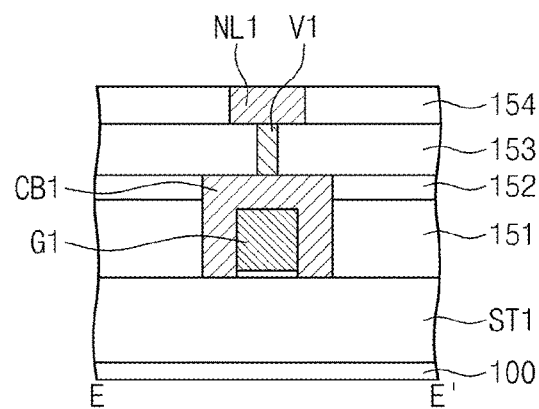

In more detail, when viewed from a plan view, a portion of the first contact CB1 may overlap with the first gate cut region CT1 and a portion of the second contact CB2 may overlap with the second gate cut region CT2. Thus, the first contact CB1 may be in direct contact with a top surface and sidewalls of one end portion of the first gate electrode G1, and the second contact CB2 may be in direct contact with a top surface and sidewalls of one end portion of the fourth gate electrode G4. For example, as illustrated in FIG. 6F, the first contact CB1 may cover both sidewalls of the one end portion of the first gate electrode G1. Thus, a contact area of the first contact CB1 and the first gate electrode G1 may be increased. Likewise, the second contact CB2 may cover both sidewalls of the one end portion of the fourth gate electrode G4. The one end portions of the first and fourth gate electrodes G1 and G4 may be adjacent to the first and second gate cut regions CT1 and CT2, respectively.

In addition, since the first contact CB1 surrounds the one end portion of the first gate electrode G1, a portion of a bottom surface of the first contact CB1 may be in direct contact with a top surface of the first device isolation layer ST1 of the first gate cut region CT1. Likewise, since the second contact CB2 surrounds the one end portion of the fourth gate electrode G4, a portion of a bottom surface of the second contact CB2 may be in direct contact with a top surface of the first device isolation layer ST1 of the second gate cut region CT2.

The first and second contacts CB1 and CB2, the first and second vias V1 and V2 and the first connection line NL1 may include at least one of a metal, a conductive metal nitride, or a doped semiconductor material. The first to fourth interlayer insulating layers 151, 152, 153, and 154 may include silicon oxide.

The first cross-coupling structure XC1 may improve an integration density of the semiconductor device including the flip-flop according to example embodiments of inventive concepts. As described above, the flip-flop according to the inventive concepts may include the second gate electrode G2 and the third gate electrode G3 which are supplied with the scan enable signal SE and are provided on the PMOSFET region PR and the NMOSFET region NR, respectively. In addition, the flip-flop according to the inventive concepts may also include the first gate electrode G1 and the fourth gate electrode G4 which are supplied with the scan enable bar signal /SE and are provided on the PMOSFET region PR and the NMOSFET region NR, respectively. To connect the first and second gate electrodes G1 and G2 to the fourth and third gate electrodes G4 and G3, respectively, the first and fourth gate electrodes G1 and G4 may be physically connected to each other to constitute one electrode and the second and the third gate electrodes G2 and G3 may be formed at both sides of the one electrode, respectively. Thereafter, the second and third gate electrodes G2 and G3 may be electrically connected to each other. In this case, three gate lines may be needed, so a width of the first region R1 in the second direction D2 may be increased.

However, according to example embodiments of inventive concepts, the connection between the first and fourth gate electrodes G1 and G4 and the connection between the second and third gate electrodes G2 and G3 may be realized using two conductive lines by the first cross-coupling structure XC1. Thus, the width of the first region R1 in the second direction D2 may be reduced. In addition, the first and second contacts CB1 and CB2 may partially overlap with the first and second gate cut regions CT1 and CT2, so the contact areas between the contacts CB1 and CB2 and the gate electrodes G1 and G4 may be increased to reduce contact resistances. Furthermore, a width of the first region R1 in the first direction D1 may be reduced by the partial overlap between the contacts CB1 and CB2 and the gate cut regions CT1 and CT2.

Referring to FIGS. 6A and 6E, a third contact CB3, a fourth via V4, and a first conductive line CBL1 may be sequentially provided on the fifth gate electrode G5. The third contact CB3 may not cover both sidewalls of the fifth gate electrode G5, unlike the first contact CB1 described with reference to FIG. 6F. In other words, all sidewalls of the third contact CB3 may be provided on the fifth gate electrode G5. In example embodiments, unlike FIGS. 6A and 6E, the first conductive line CBL1 may be offset from the fifth gate electrode G5. Thus, it is possible to limit and/or prevent a short between the first conductive line CBL1 and neighboring lines (e.g., a second conductive line CBL2).

Referring again to FIGS. 6A, 6B, 6C, and 6D, a plurality of active portions AP may be provided on each of the PMOSFET and NMOSFET regions PR and NR. In example embodiments, the active portions AP may be defined by second device isolation layers ST2 extending in the second direction D2. In other words, the active portions AP may be defined by portions of the substrate 100 that protrude vertically between the second device isolation layers ST2. Each of the active portions AP may have a fin pattern FN protruding from between the second device isolation layers ST2. The active portions AP may intersect the gate electrodes G1 to G5 and may extend in the second direction D2. The first gate electrode G1 and the second gate electrode G2 cross over the fins in the PMOSFET region PR, and the third gate electrode G3 and the fourth gate electrode G4 cross over the fins in the NMOSFET region NR.

FIG. 6A illustrates three active portions AP provided on each of the PMOSFET and NMOSFET regions PR and NR. However, inventive concepts are not limited thereto. The first device isolation layer ST1 and the second device isolation layers ST2 may be connected to each other to constitute one united body. A thickness of the first device isolation layer ST1 may be greater than those of the second device isolation layers ST2. In other words, a bottom surface of the first device isolation layer ST1 may be deeper than those of the second device isolation layers ST2. In this case, the second device isolation layers ST2 may be formed by an additional process different from a process of forming the first device isolation layer ST1. In example embodiments, the second device isolation layers ST2 and the first device isolation layer ST1 may be formed at the same time and may have the substantially same thickness (e.g., the substantially same depth). The first and second device isolation layers ST1 and ST2 may be formed in an upper portion of the substrate 100. For example, the first and second device isolation layers ST1 and ST2 may include a silicon oxide layer.

Source/drain regions SD may be formed in portions of the active portions AP which are not covered with the gate electrodes G1 to G5. The source/drain regions SD may be confined in the fin patterns FN. Alternatively, the source/drain regions SD may extend into the upper portion of the substrate 100, e.g., between the second device isolation layers ST2. The source/drain regions SD of the PMOSFET region PR may be P-type dopant regions, and the source/drain regions SD of the NMOSFET region NR may be N-type dopant regions.

The source/drain regions SD of the PMOSFET region PR, which are spaced apart from each other in the first direction D1 with the second device isolation layers ST2 interposed therebetween, may be electrically connected to each other by connection conductive patterns CA. In other words, each of the connection conductive patterns CA may cover the active portions AP in common and may connect the source/drain regions SD arranged in the first direction D1 to each other. The connection conductive patterns CA may be connected directly to the active portions AP. The connection conductive patterns CA may include a metal silicide. For example, the connection conductive patterns CA may include at least one of titanium silicide, tantalum silicide, or tungsten silicide. The connection conductive pattern CA may further include a metal layer. For example, the metal layer may include at least one of titanium, tantalum, or tungsten. In example embodiments, each of the connection conductive patterns CA may include the metal silicide layer and the metal layer on the metal silicide layer.

The source/drain regions SD of the NMOSFET region NR may be connected to each other through connection conductive patterns CA by the same method as the source/drain regions SD of the PMOSFET region PR. In other words, the source/drain regions SD of the NMOSFET region NR, which are spaced apart from each other in the first direction D1 with the second device isolation layers ST2 interposed therebetween, may be connected to each other by the connection conductive pattern CA. The connection conductive patterns CA may be provided in the first and second interlayer insulating layers 151 and 152.

The first logic cell C1 may include a first common conductive line PW1 provided between the PMOSFET region PR and the second logic cell C2 adjacent to the first logic cell C1 in the first direction D1, and a second common conductive line PW2 provided between the NMOSFET region NR and the third logic cell C3 adjacent to the first logic cell C1 in the first direction D1. In example embodiments, the first common conductive line PW1 adjacent to the PMOSFET region PR may be an electrical path through which a drain voltage VDD (e.g., a power voltage) is provided. In example embodiments, the second common conductive line PW2 adjacent to the NMOSFET region NR may be an electrical path through which a source voltage VSS (e.g., a ground voltage) is provided.

The first and second common conductive lines PW1 and PW2 may extend in the second direction D2 and may be shared by logic cells arranged in the second direction D2. In addition, the first common conductive line PW1 may be shared by the PMOSFET region PR of the first logic cell C1 and the PMOSFET region PR of the second logic cell C2, and the second common conductive line PW2 may be shared by the NMOSFET region NR of the first logic cell C1 and the NMOSFET region NR of the third logic cell C3.

A third via V3 may be provided on the connection conductive pattern CA. Some of the source/drain regions SD of the PMOSFET region PR may be connected to the first common conductive line PW1 through the connection conductive pattern CA and the third via V3. Likewise, some of the source/drain regions SD of the NMOSFET region NR may be connected to the second common conductive line PW2 through the connection conductive pattern CA and the third via V3.

Figure 7:
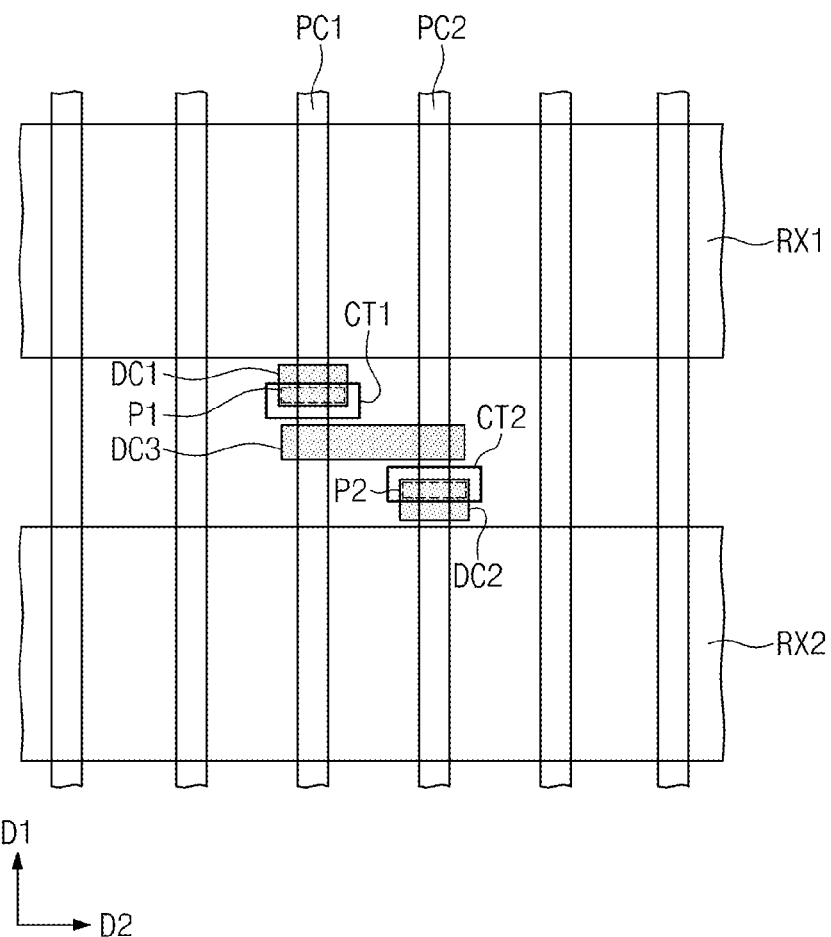
FIG. 7 is a plan view illustrating a layout of a semiconductor device according to example embodiments of inventive concepts.

FIG. 7 is a plan view illustrating a layout of a semiconductor device according to example embodiments of inventive concepts. In detail, FIG. 7 is a plan view illustrating a layout of some elements of the first region R1 of FIGS. 2 and 3.

Referring to FIG. 7, a first active region layout RX1 and a second active region layout RX2 may be disposed. PMOS transistors may be formed on the first active region layout RX1, and NMOS transistors may be formed on the second active region layout RX2. The first active region layout RX1 may define the PMOSFET region PR of the substrate 100, and the second active region layout RX2 may define the NMOSFET region NR of the substrate 100.

Gate layouts PC1 and PC2 defining gates of transistors may be disposed. The gate layouts PC1 and PC2 may extend in parallel to each other in a first direction D1. Each of the gate layouts PC1 and PC2 may intersect both the first active region layout RX1 and the second active region layout RX2.

A first gate cut region CT1 may be disposed on a first gate layout PC1. The first gate cut region CT1 may define a region of a first gate structure GS1 that will be patterned. In more detail, the first gate cut region CT1 may define a region by which a first gate electrode G1 will be separated from a third gate electrode G3. A second gate cut region CT2 may be disposed on a second gate layout PC2 adjacent to the first gate layout PC1. The second gate cut region CT2 may define a region of a second gate structure GS2 that will be patterned. In more detail, the second gate cut region CT2 may define a region by which a second gate electrode G2 will be separated from a fourth gate electrode G4. The first and second gate cut regions CT1 and CT2 may be disposed between the first and second active region layouts RX1 and RX2 when viewed from a plan view.

A first contact layout DC1 (or named first contact region) and a second contact layout DC2 may be disposed on the first gate layout PC1 and the second gate layout PC2, respectively. The first contact layout DC1 may define a first contact CB1 to be described later, and the second contact layout DC2 may define a second contact CB2 to be described later. When viewed from a plan view, the first contact layout DC1 may include a first area P1 overlapping with the first gate cut region CT1 and the second contact layout DC2 may include a second area P2 overlapping with the second gate cut region CT2.

As described above, contact areas between contacts and gate electrodes may be increased by the first and second areas P1 and P2, so contact resistances between the contacts and the gate electrodes may be reduced. In addition, a width of the semiconductor device in the first direction D1 may be reduced.

A third contact layout DC3 may be disposed between the first and second gate cut regions CT1 and CT2. The third contact layout DC3 may extend in a second direction D2 intersecting the first direction D1 to intersect the first and second gate layouts PC1 and PC2. The third contact layout DC3 may define a first connection contact NC1 to be described later.

FIGS. 8A to 12A are plan views illustrating a method for manufacturing the first region of FIGS. 2 and 3. FIGS. 8B to 12B are cross-sectional views taken along lines A-A' of FIGS. 8A to 12A, respectively. FIG. 12C is a cross-sectional view taken a line B-B' of FIG. 12A. FIGS. 10C, 11C, and 12D are cross-sectional views taken along lines C-C' of FIGS. 10A, 11A, and 12A, respectively.

Figure 8A:
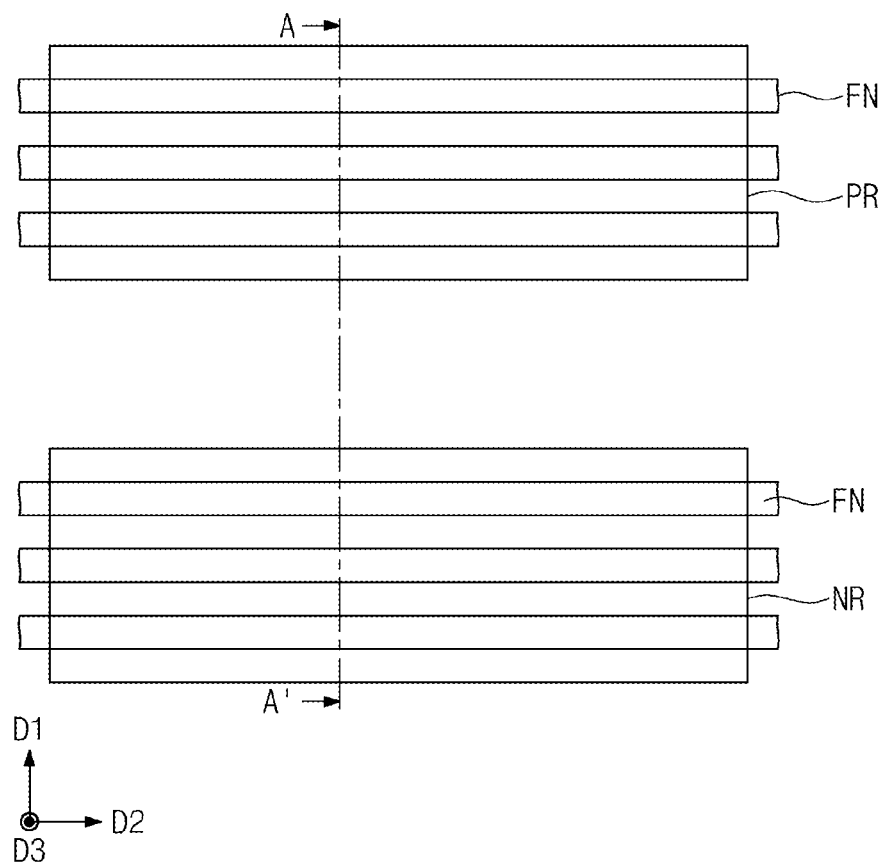
Figure 8B:
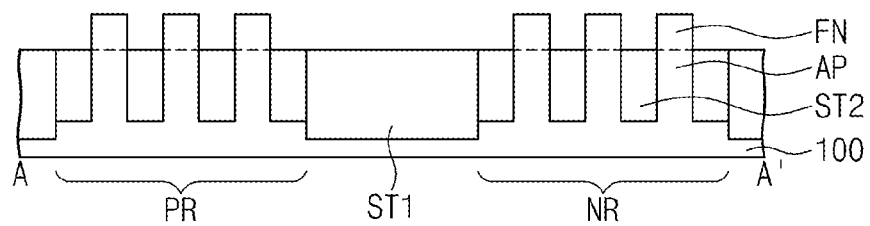

Referring to FIGS. 8A and 8B, a substrate 100 may be provided. For example, the substrate 100 may be a silicon substrate, a germanium substrate, or a SOI substrate.

A first device isolation layer ST1 may be formed in the substrate 100 to define a PMOSFET region PR and an NMOSFET region NR. In addition, second device isolation layers ST2 may be formed in the substrate 100 to define a plurality of active portions AP on each of the PMOSFET and NMOSFET regions PR and NR. The first and second device isolation layers ST1 and ST2 may be formed by a shallow-trench isolation (STI) technique and may include, for example, a silicon oxide layer.

The first and second device isolation layers ST1 and ST2 may have depths in a direction opposite to a third direction D3. The third direction D3 may be perpendicular to first and second directions D1 and D2 and may be perpendicular to a top surface of the substrate 100. In example embodiments, the depths of the second device isolation layers ST2 may be smaller than that of the first device isolation layer ST1. In this case, the second device isolation layers ST2 may be formed using an additional process different from a process of forming the first device isolation layer ST1. In example embodiments, the second device isolation layers ST2 and the first device isolation layer ST1 may be formed at the same time. In this case, the depths of the second device isolation layers ST2 may be substantially equal to that of the first device isolation layer ST1.

The active portions AP may have fin patterns FN protruding from between the second device isolation layers ST2 extending in the second direction D2. The active portions AP may extend in the second direction D2.

Figure 9A:
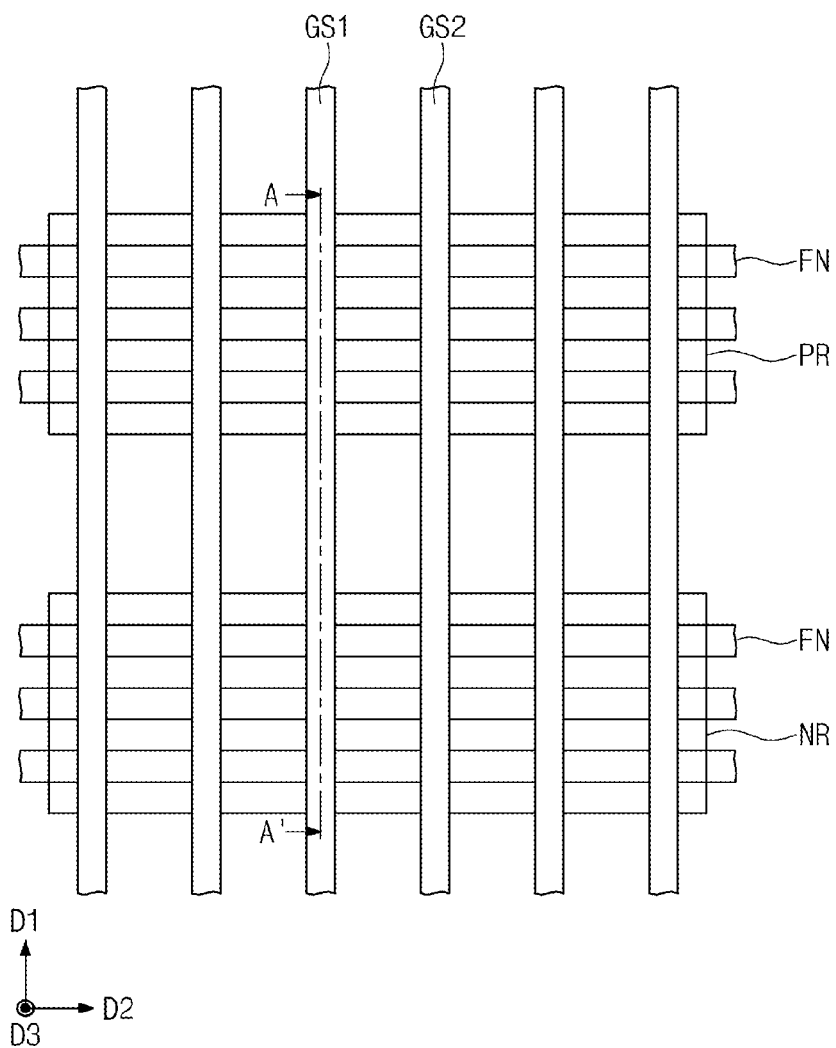
Figure 9B:
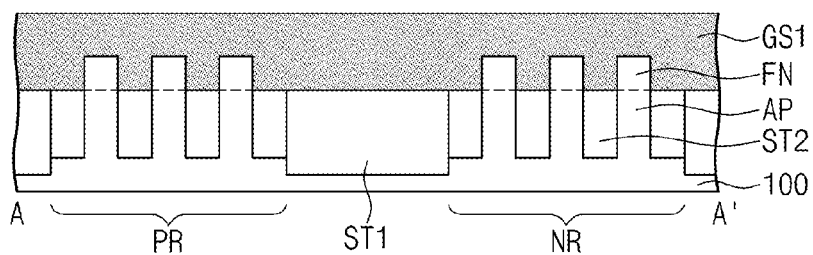

Referring to FIGS. 9A and 9B, gate structures GS1 and GS2 may be formed on the substrate 100. The gate structures GS1 and GS2 may intersect the active portions AP and may extend along the first direction D1 in parallel to each other. Each of the gate structures GS1 and GS2 may intersect both the PMOSFET region PR and the NMOSFET region NR. The gate structures GS1 and GS2 may correspond to the gate layouts PC1 and PC2 described with reference to FIG. 7, respectively. In example embodiments, the gate structures GS1 and GS2 may be sacrificial gates. For example, the gate structures GS1 and GS2 may include poly-silicon.

Figure 10A:
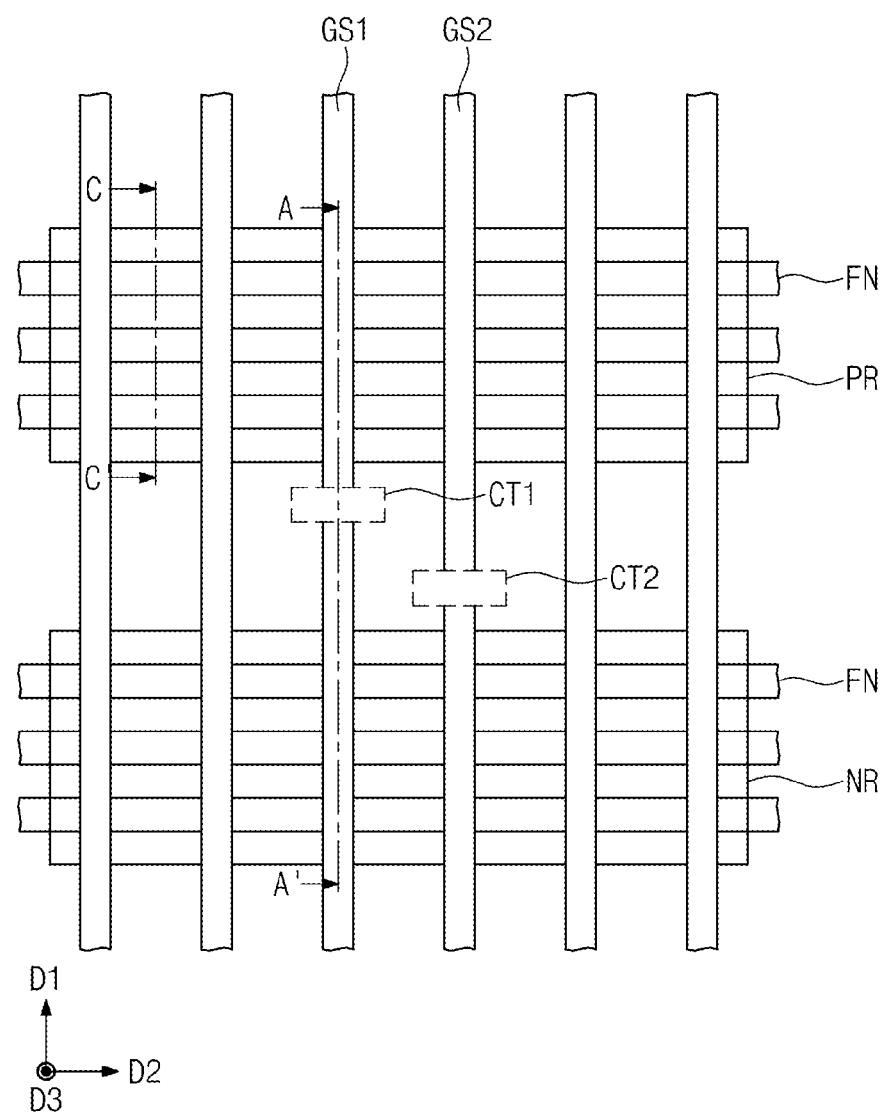
Figure 10B:
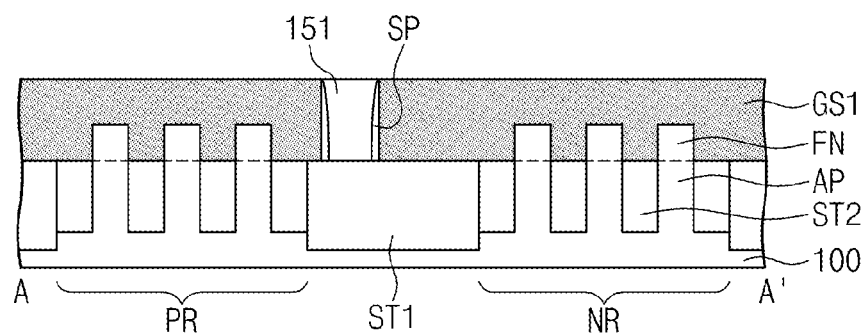
Figure 10C:
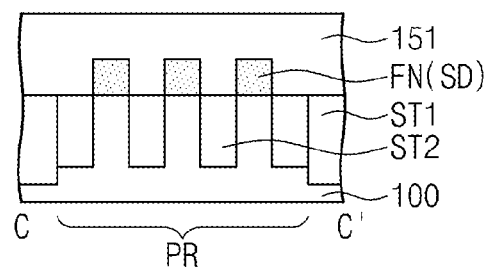
FIGS. 10C, 11C, and 12D are cross-sectional views taken along lines C-C' of FIGS. 10A, 11A, and 12A, respectively.

Referring to FIGS. 10A, 10B, and 10C, each of first and second gate structures GS1 and GS2 may be patterned to be divided into two gate structures. By the patterning process, a portion of the first gate structure GS1 overlapping with the first gate cut region CT1 may be removed and a portion of the second gate structure GS2 overlapping with the second gate cut region CT2 may be removed. The patterning process may be performed using a mask in which the first and second gate cut regions CT1 and CT2 are defined.

Ion implantation processes may be performed on the substrate 100 having the gate structures GS1 and GS2 to form source/drain regions SD. The source/drain regions SD may be formed in upper portions of the active portions AP at both sides of each of the gate structures GS1 and GS2.

In example embodiments, the upper portions of the active portions AP disposed at both sides of each of the gate structures GS1 and GS2 may be recessed, and a selective epitaxial growth (SEG) process may be performed on the recessed active portions AP to form the source/drain regions SD. The source/drain regions SD of the PMOSFET region PR may be doped with P-type dopants, and the source/drain regions SD of the NMOSFET region NR may be doped with N-type dopants.

In example embodiments, if the first and second gate structures GS1 and GS2 are the sacrificial gates, spacers SP may be formed to cover sidewalls of the first and second gate structures GS1 and GS2 after the patterning process using the mask having the first and second gate cut regions CT1 and CT2. Next, an insulating layer may be formed to cover the first and second gate structures GS1 and GS2 and the spacers SP, and then the insulating layer may be planarized until top surfaces of the gate structures GS1 and GS2 are exposed, thereby forming a first interlayer insulating layer 151. The first interlayer insulating layer 151 may cover all of the source/drain regions SD. The first interlayer insulating layer 151 may include silicon oxide.

Figure 11A:
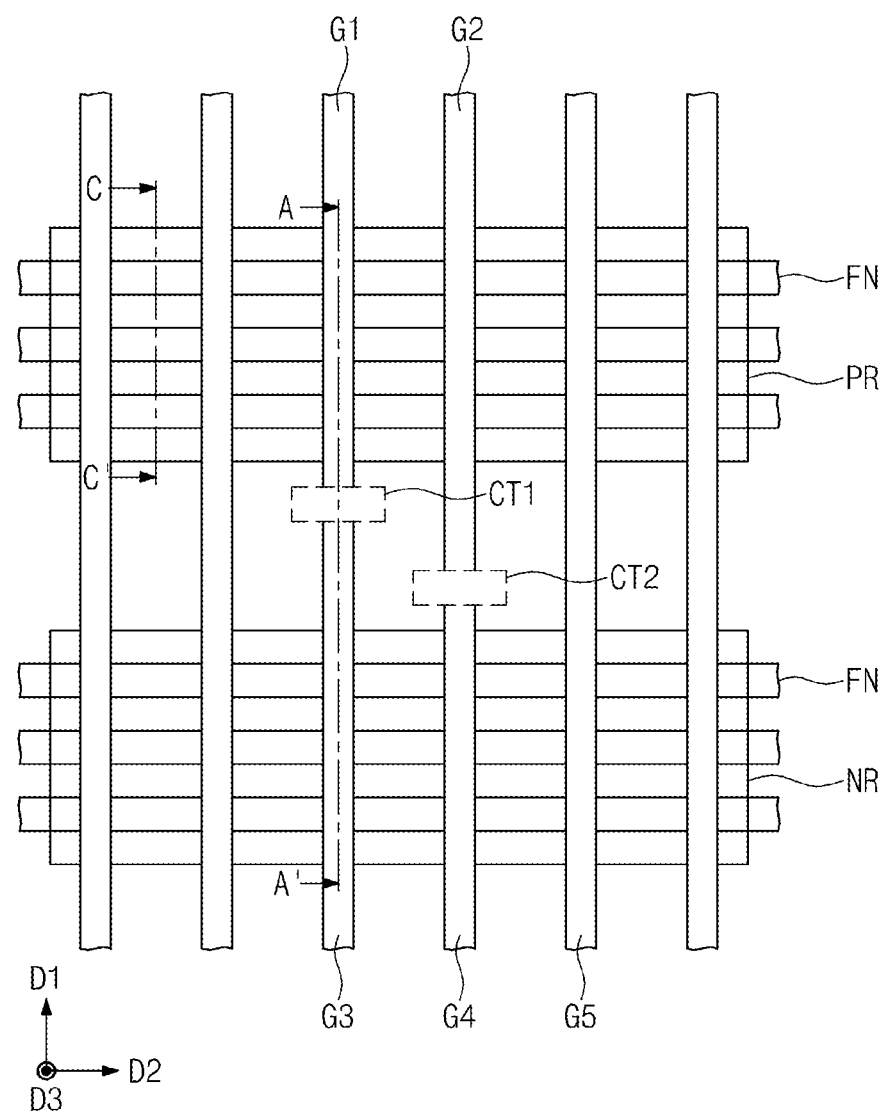
Figure 11B:
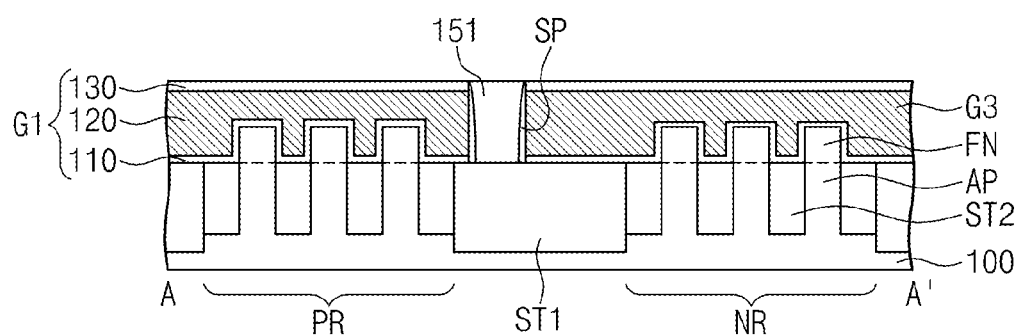
Figure 11C:
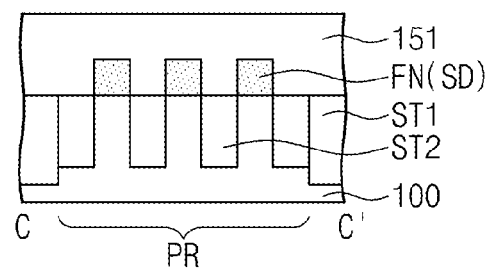
Figure 12A:
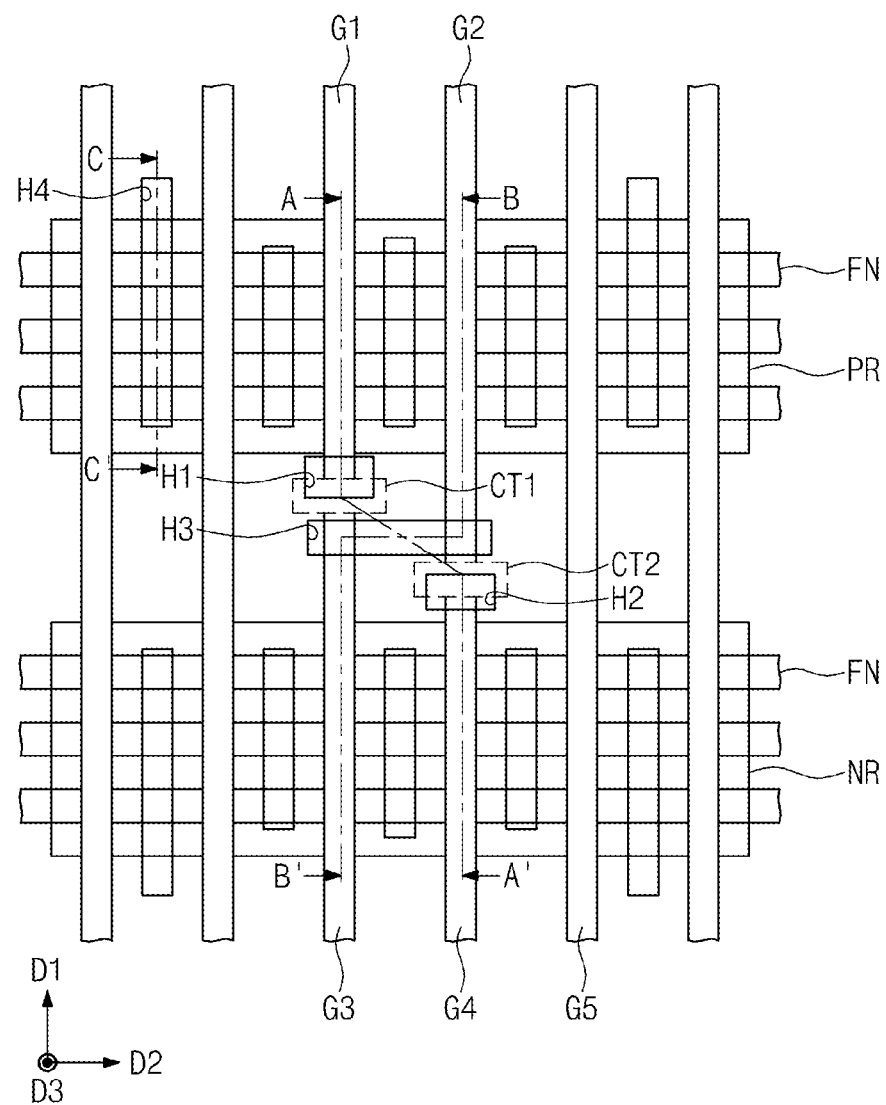
Figure 12B:
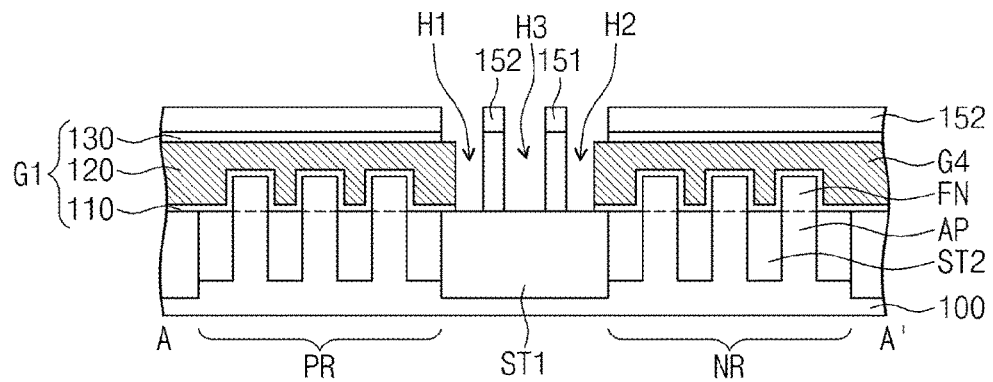
Figure 12C:
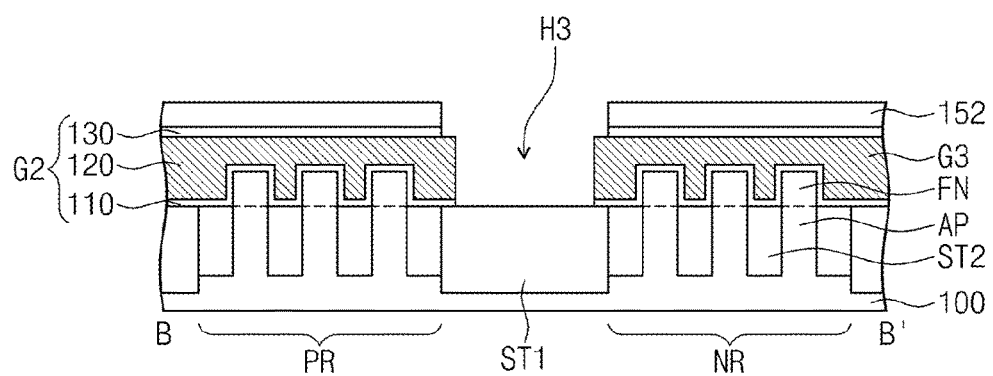
FIG. 12C is a cross-sectional view taken a line B-B' of FIG. 12A.
Figure 12D:
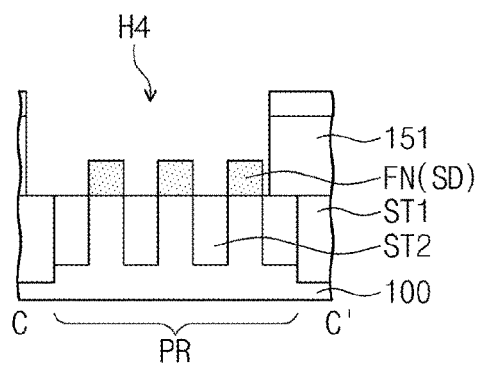

Referring to FIGS. 11A, 11B, and 11C, the gate structures GS1 and GS2 may be replaced with gate electrodes G1 to G5. Each of the gate electrodes G1 to G5 may include a gate insulating pattern 110, a gate line 120, and a capping pattern 130.

In more detail, the exposed gate structures GS1 and GS2 may be selectively removed to form trenches. A gate insulating layer may be conformally formed on inner sidewalls and bottom surfaces of the trenches. A gate conductive layer may be formed on the gate insulating layer to completely fill the trenches. Subsequently, the gate conductive layer and the gate insulating layer may be planarized to form the gate insulating patterns 110 and the gate lines 120. Next, the capping patterns 130 may be formed to cover top surfaces of the gate lines 120, respectively. This process of forming the gate electrodes G1 to G5 using the sacrificial gates may be defined as a last gate process.

In example embodiments, the last gate process is described as an example. However, inventive concepts are not limited thereto. In example embodiments, a first gate process may be applied to example embodiments of inventive concepts. If the first gate process is applied to example embodiments of inventive concepts, each of the gate structures GS1 and GS2 described above may be formed to include a gate insulating pattern 110 and a gate line 120. Thereafter, the gate structures GS1 and GS2 may be patterned using the mask having the first and second gate cut regions CT1 and CT2 of FIG. 7 to form a resultant structure similar to the structure illustrated in FIGS. 11A to 11C.

Referring to FIGS. 12A, 12B, 12C, and 12D, a second interlayer insulating layer 152 may be formed on the first interlayer insulating layer 151. Next, a patterning process may be performed to form contact holes H1 to H4 penetrating the second and first interlayer insulating layers 152 and 151.

To form first to third contact holes H1, H2, and H3, a mask may be manufactured based on the first to third contact layouts DC1, DC2, and DC3 described with reference to FIG. 7. The mask may correspond to a reticle used in a photolithography process.

The process of forming the first to third contact holes H1 to H3 may use an anisotropic etching process. During the anisotropic etching process, the gate lines 120 under openings defined by the first to third contact layouts DC1 to DC3 may remain but portions of the capping patterns 130, the spacers SP and the first and second interlayer insulating layers 151 and 152 under the openings may be removed. The anisotropic etching process may be performed until the top surface of the first device isolation layer ST1 is exposed.

The first contact hole H1 may expose one end portion of the first gate electrode G1 (e.g., the gate line 120 of the first gate electrode G1). In other words, the first contact hole H1 may expose a top surface and sidewalls of the one end portion of the first gate electrode G1. The second contact hole H2 may expose one end portion of the fourth gate electrode G4 (e.g., the gate line 120 of the fourth gate electrode G4). In other words, the second contact hole H2 may expose a top surface and sidewalls of the one end portion of the fourth gate electrode G4. The first and second contact holes H1 and H2 may partially overlap with the first and second gate cut regions CT1 and CT2, respectively.

The third contact hole H3 may expose one end portion of the second gate electrode G2 and one end portion of the third gate electrode G3 at the same time. The third contact hole H3 may be disposed between the first and second gate cut regions CT1 and CT2. The one end portions of the first to fourth gate electrodes G1 to G4 may be adjacent to the first and second gate cut regions CT1 and CT2.

Fourth contact holes H4 may be formed between the gate electrodes G1 to G5. The fourth contact holes H4 may be formed on the PMOSFET region PR and the NMOSFET region NR. The fourth contact holes H4 may expose the source/drain regions SD.

Referring again to FIGS. 6A to 6F, a conductive layer may be formed on the second interlayer insulating layer 152 to fill the contact holes H1 to H4. The conductive layer may include at least one of a metal, a conductive metal nitride, or a doped semiconductor material.

The conductive layer may be planarized until the second interlayer insulating layer 152 is exposed, thereby forming a first contact CB1, a second contact CB2, and a first connection contact NC1 in the first, second, and third contact holes H1, H2, and H3, respectively. By the planarization process, top surfaces of the first and second contacts CB1 and CB2 and the first connection contact NC1 may be substantially coplanar with a top surface of the second interlayer insulating layer 152.

In addition, connection conductive patterns CA may be respectively formed in the fourth contact holes H4 by the planarization process of the conductive layer. The connection conductive patterns CA may be connected to the source/drain regions SD at both sides of each of the gate electrodes G1 to G5. Each of the connection conductive patterns CA may have a bar shape extending in the first direction D1.

A third interlayer insulating layer 153 may be formed on the second interlayer insulating layer 152. Vias V1 to V3 may be formed to penetrate the third interlayer insulating layer 153. The vias V1 to V3 may be connected to the first and second contacts CB1 and CB2 and the connection conductive patterns CA. Next, a fourth interlayer insulating layer 154 may be formed on the third interlayer insulating layer 153. First and second common conductive lines PW1 and PW2 and a first connection line NL1 may be formed in the fourth interlayer insulating layer 154. The first and second common conductive lines PW1 and PW2 and the first connection line NL1 may penetrate the fourth interlayer insulating layer 154 so as to be connected to the vias V1 to V3.

Figure 13A:
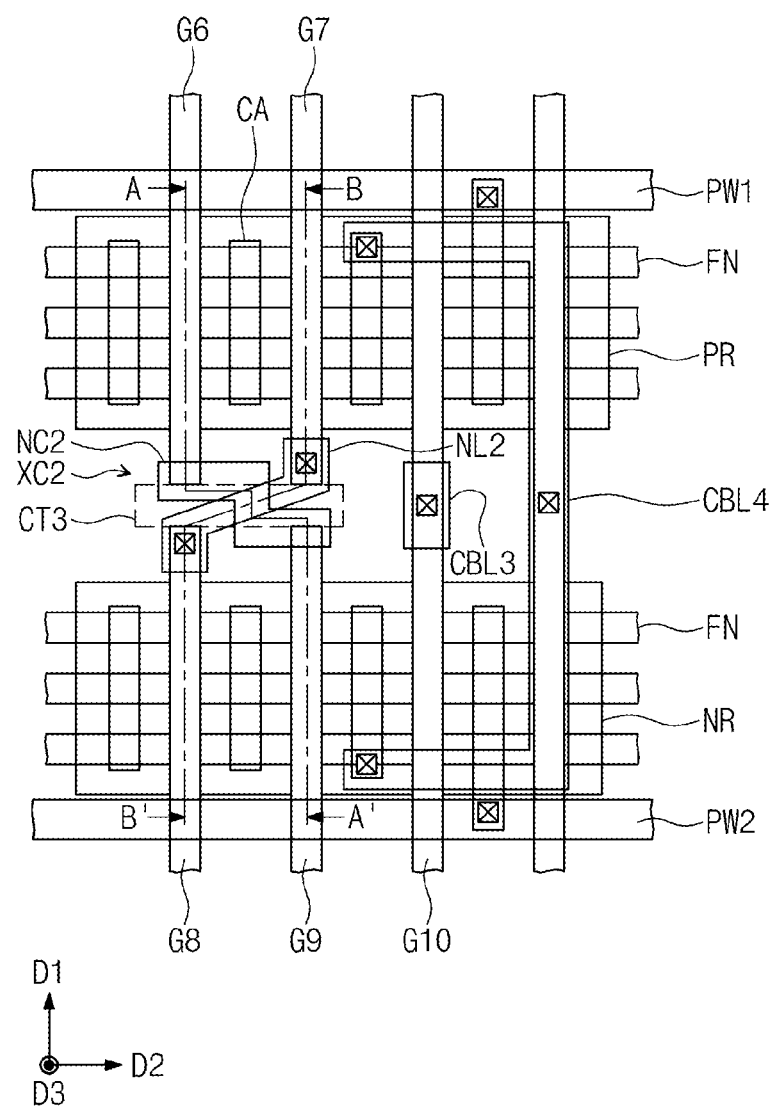
FIG. 13A is a plan view illustrating the second region of FIGS. 2 and 3.
Figure 13B:
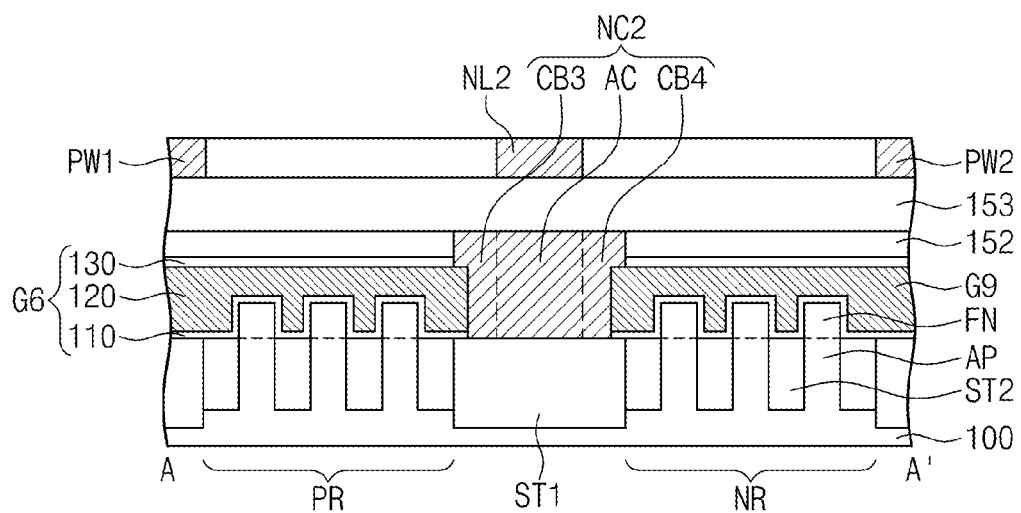
FIGS. 13B and 13C are cross-sectional views taken along lines A-A' and B-B' of FIG. 13A, respectively.
Figure 13C:
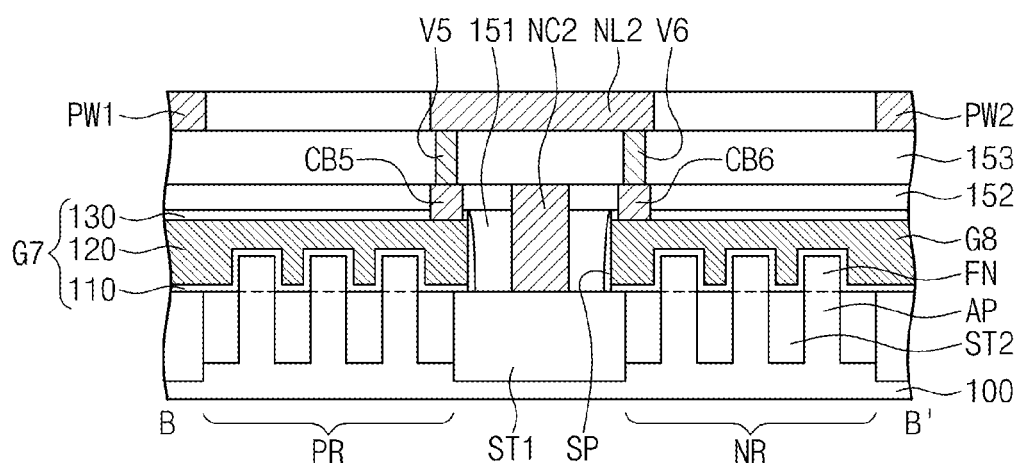

FIG. 13A is a plan view illustrating the second region of FIGS. 2 and 3. FIGS. 13B and 13C are cross-sectional views taken along lines A-A' and B-B' of FIG. 13A, respectively. Hereinafter, differences between the present embodiment and the embodiment of FIGS. 6A to 6F will be mainly described to avoid redundancy. The same elements as described in the above mentioned embodiment will be indicated by the same reference numerals or the same reference designators.

Referring to FIGS. 13A, 13B, and 13C, gate electrodes G6 to G10 may be provided in the second region R2. Each of sixth to ninth gate electrodes G6 to G9 may be disposed on an NMOSFET region NR or a PMOSFET region PR. In example embodiments, the sixth gate electrode G6 and the seventh gate electrode G7 may be provided on the PMOSFET region PR, and the eighth gate electrode G8 and the ninth gate electrode G9 may be provided on the NMOSFET region NR. The sixth gate electrode G6 and the eighth gate electrode G8 may be aligned with each other in an extending direction of the sixth and eighth gate electrodes G6 and G8 (e.g., in the first direction D1). The seventh gate electrode G7 and the ninth gate electrode G9 may be aligned with each other in an extending direction of the seventh and ninth gate electrode G7 and G9 (e.g., in the first direction D1).

A third gate cut region CT3 may pass through between the sixth and eighth gate electrodes G6 and G8. Unlike the first and second gate cut regions CT1 and CT2 of FIG. 6A, the third gate cut region CT3 may extend to also pass through between the seventh and ninth gate electrodes G7 and G9.

In other words, the sixth and eighth gate electrodes G6 and G8 may be spaced apart from each other in the first direction D1 with the third gate cut region CT3 interposed therebetween, and the seventh and ninth gate electrodes G7 and G9 may also be spaced apart from each other in the first direction D1 with the third gate cut region CT3 interposed therebetween. The third gate cut region CT3 may be defined on the first device isolation layer ST1 between the PMOSFET region PR and the NMOSFET region NR.

In more detail, the sixth to ninth gate electrodes G6 to G9 may be formed by patterning a pair of gate structures extending in the first direction D1 at the same time. At this time, the patterning process may be performed using the third gate cut region CT3 on a layout.

The sixth gate electrode G6 may correspond to a gate electrode of the transistor, supplied with the clock signal CLK, of the third element E3 described with reference to FIGS. 3 and 5. The seventh gate electrode G7 may correspond to a gate electrode of the transistor, supplied with the clock bar signal /CLK, of the fourth element E4 of FIGS. 3 and 5. The eighth gate electrode G8 may correspond to a gate electrode of the transistor, supplied with the clock bar signal /CLK, of the third element E3. The ninth gate electrode G9 may correspond to a gate electrode of the transistor, supplied with the clock signal CLK, of the fourth element E4.

The tenth gate electrode G10 may extend in the first direction D1 to intersect both the PMOSFET region PR and the NMOSFET region NR.

A second cross-coupling structure XC2 may be provided in the second region R2. The second cross-coupling structure XC2 may electrically connect the sixth gate electrode G6 to the ninth gate electrode G9 and may electrically connect the seventh gate electrode G7 to the eighth gate electrode G8. The second cross-coupling structure XC2 may be provided on the first device isolation layer ST1 between the PMOSFET region PR and the NMOSFET region NR. The second cross-coupling structure XC2 may include a third connection structure connecting the sixth gate electrode G6 to the ninth gate electrode G9 and a fourth connection structure connecting the seventh gate electrode G7 to the eighth gate electrode G8.

The third connection structure may include a second connection contact NC2. The second connection contact NC2 may be a structure used to apply the clock signal CLK to the sixth and ninth gate electrodes G6 and G9 at the same time. The second connection contact NC2 may include an active contact AC, a third contact CB3, and a fourth contact CB4. The active contact AC may be provided on the first device isolation layer ST1 to intersect the third gate cut region CT3. The third contact CB3 and the fourth contact CB4 may extend from both end portions of the active contact AC onto the sixth gate electrode G6 and the ninth gate electrode G9, respectively.

In more detail, the active contact AC may be in direct contact with the first device isolation layer ST1 and may extend between the third and fourth contacts CB3 and CB4. Portions of the third and fourth contacts CB3 and CB4 may overlap with the third gate cut region CT3 when viewed from a plan view. Thus, the third contact CB3 may be in direct contact with a top surface and sidewalls of one end portion of the sixth gate electrode G6 (e.g., one end portion of the gate line 120 of the sixth gate electrode G6), and the fourth contact CB4 may be in direct contact with a top surface and sidewalls of one end portion of the ninth gate electrode G9 (e.g., one end portion of the gate line 120 of the sixth gate electrode G9). The one end portions of the sixth and ninth gate electrodes G6 and G9 may be adjacent to the third gate cut region CT3. Other features of the third and fourth contacts CB3 and CB4 may be the substantially same as corresponding features of the first and second contacts CB1 and CB2 described with reference to FIGS. 6A to 6F.

The active contact AC and the third and fourth contacts CB3 and CB4 may constitute one united body without interfaces therebetween. In example embodiments, a first contact hole for the formation of the active contact AC and second contact holes for the formation of the third and fourth contacts CB3 and CB4 may be formed using etching processes different from each other, and the second connection contact NC2 may be formed by filling the first and second contact holes with a conductive material. The second connection contact NC2 may be formed of at least one of a metal, a conductive metal nitride, or a doped semiconductor material. For example, the second connection contact NC2 may include at least one of tungsten, titanium, tantalum, tungsten nitride, titanium nitride, or tantalum nitride.

The fourth connection structure may include fifth and sixth contacts CB5 and CB6, a second connection line NL2, and fifth and sixth vias V5 and V6. The fifth and sixth contacts CB5 and CB6 may be in direct contact with the seventh and eighth gate electrodes G7 and G8, respectively, and the second connection line NL2 may electrically connect the seventh and eighth gate electrodes G7 and G8 to each other. The fifth and sixth vias V5 and V6 may be disposed between the second connection line NL2 and the fifth and sixth contacts CB5 and CB6, respectively. The second connection line NL2 may be a structure used to apply the clock bar signal /CLK to the seventh and eighth gate electrodes G7 and G8 at the same time. The second connection line NL2 may be vertically spaced apart from the second connection contact NC2. The second connection line NL2 may intersect the second connection contact NC2 when viewed from a plan view. In more detail, the second connection line NL2 may intersect the second connection contact NC2 on the first device isolation layer ST1.

The fifth and sixth contacts CB5 and CB6 may not overlap with the third gate cut region CT3 when viewed from a plan view. In other words, the fifth and sixth contacts CB5 and CB6 may be in contact with only top surfaces of the seventh and eighth gate electrodes G7 and G8 (e.g., top surfaces of the gate lines 120 of the seventh and eighth gate electrodes G7 and G8), unlike the first and second contacts CB1 and CB2 described with reference to FIGS. 6A to 6F. The fifth and sixth contacts CB5 and CB6 may be similar to the third contact CB3 described with reference to FIG. 6E.

The fourth region R4 of FIG. 2 may include the second cross-coupling structure XC2 or a third cross-coupling structure that is the substantially same as the first cross-coupling structure XC1.

The second cross-coupling structure XC2 may include the structure applying the clock signal CLK to the sixth and ninth gate electrodes G6 and G9 at the same time and the structure applying the clock bar signal /CLK to the seventh and eighth gate electrodes G7 and G8 at the same time. Here, in example embodiments of inventive concepts, the second cross-coupling structure XC2 may be realized using two conductive lines. Thus, a width of the semiconductor device in the second direction D2 may be reduced. In addition, a width of the semiconductor device in the first direction D1 may be also reduced by the third and fourth contacts CB3 and CB4 partially overlapping with the third gate cut region CT3 and the active contact AC intersecting the third gate cut region CT3.

The second cross-coupling structure XC2 according to example embodiments of inventive concepts may correspond to a structure which can be modified from the first cross-coupling structure XC1 described with reference to FIGS. 6A to 6F. Thus, in example embodiments, the second cross-coupling structure XC2 may be used in the first region R1 and the first cross-coupling structure XC1 may be used in the second region R2.

Figure 14:
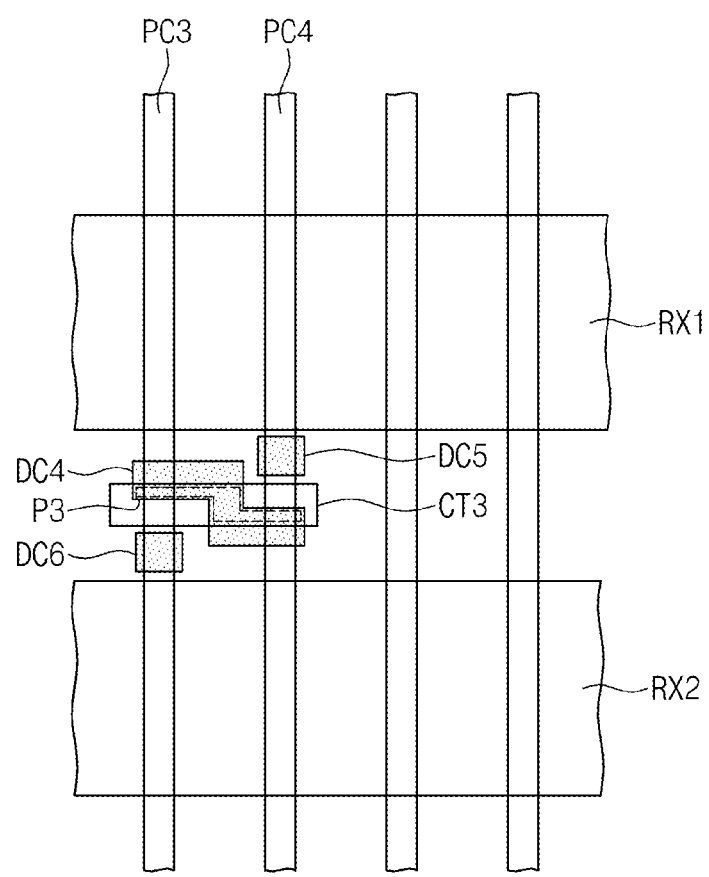
FIG. 14 is a plan view illustrating a layout of a semiconductor device according to example embodiments of inventive concepts.

FIG. 14 is a plan view illustrating a layout of a semiconductor device according to example embodiments of inventive concepts. In detail, FIG. 14 is a plan view illustrating layouts of some elements of the second region R2 of FIGS. 2 and 3.

Referring to FIG. 14, a third gate cut region CT3 may be disposed to intersect both third and fourth gate layouts PC3 and PC4, unlike FIG. 7. The third gate cut region CT3 may define a region in which gate structures will be patterned. In addition, the third gate cut region CT3 may define the region in which sixth to ninth gate electrodes G6 to G9 will be separated from each other (see FIGS. 13A to 13C).

A fourth contact layout DC4 may be disposed on the third and fourth gate layouts PC3 and PC4. The fourth contact layout DC4 may intersect both the third and fourth gate layouts PC3 and PC4. The fourth contact layout DC4 may define a region in which the second connection contact NC2 described above will be formed. When viewed from a plan view, the fourth contact layout DC4 may include third area P3 overlapping with the third gate cut region CT3. Contact areas between the second connection contact NC2 and the sixth and ninth gate electrodes G6 and G9 may be increased through the third area P3, so contact resistances therebetween may be reduced. In addition, the width of the semiconductor device in the first direction D1 may be reduced.

Fifth and sixth contact layouts DC5 and DC6 may be disposed on the forth and third gate layouts PC4 and PC3, respectively. The fifth and sixth contact layouts DC5 and DC6 may define regions in which the fifth and sixth contacts CB5 and CB6 described above will be formed.

As described above, the method for manufacturing the first region R1 of FIGS. 2 and 3 was described as an example. However, the second to fifth regions R2 to R5 of FIGS. 2 and 3 may be formed together with the first region R1 by a similar method to the manufacturing method described above.

Figure 15:
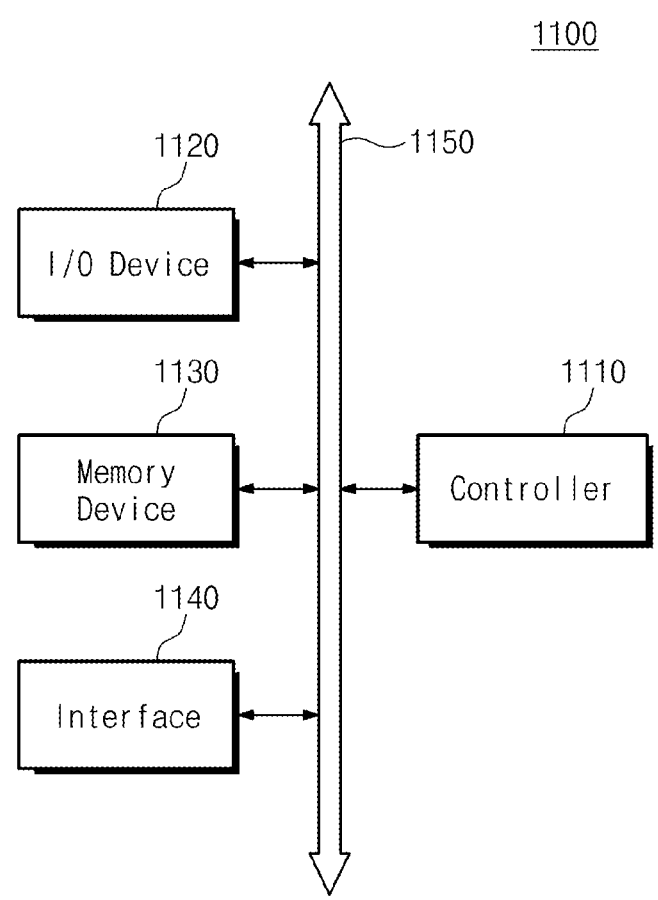
FIG. 15 is a schematic block diagram illustrating an electronic system including a semiconductor device according to example embodiments of inventive concepts.

FIG. 15 is a schematic block diagram illustrating an electronic system including a semiconductor device according to example embodiments of inventive concepts.

Referring to FIG. 15, an electronic system 1100 according to an embodiment of the inventive concept may include a controller 1110, an input/output (I/O) device 1120, a memory device 1130, an interface unit 1140, and a data bus 1150. At least two of the controller 1110, the I/O device 1120, the memory device 1130, and the interface unit 1140 may communicate with each other through the data bus 1150. The data bus 1150 may correspond to a path through which electrical data are transmitted.

The controller 1110 may include at least one of a microprocessor, a digital signal processor, a microcontroller, or other logic devices having a similar function to any one thereof. The I/O device 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a cache memory for improving an operation of the controller 1110. At least one of the semiconductor devices according to the above mentioned embodiments may be provided into the controller 1110 and/or the I/O device 1120.

The electronic system 1100 may be applied to a personal digital assistant (PDA), a portable computer, a web tablet, a wireless phone, a mobile phone, a digital music player, a memory card, or other electronic products. The other electronic products may receive or transmit information data by wireless.

In semiconductor devices according to example embodiments of inventive concepts, the contact of the cross-coupling structure may partially overlap with the gate cut region. Thus, an integration density and electrical characteristics of the semiconductor device may be improved.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. It will be understood by one of ordinary skill in the art that variations in form and detail may be made therein without departing from the spirit and scope of the claims.

What is claimed is:

1. A semiconductor device comprising:
a substrate including a PMOSFET region and an NMOSFET region;
a first gate electrode and a second gate electrode on the PMOSFET region;
a third gate electrode and a fourth gate electrode on the NMOSFET region,
the first to fourth gate electrodes defining a gate cut region that passes between the first and third gate electrodes and between the second and fourth gate electrodes; and
a first contact and a second contact connected to the first gate electrode and the fourth gate electrode, respectively,
a portion of each of the first and second contacts overlap with the gate cut region when viewed from a plan view such that a part of the first contact covers and extends along a sidewall of the first gate electrode in a thickness direction of the first gate electrode in the gate cut region and a part of the second contact covers and extends along a sidewall of the fourth gate electrode in the gate cut region.

2. The semiconductor device of claim 1, further comprising:
a first connection structure including the first and second contacts, the first connection structure connecting the first and fourth gate electrodes to each other; and
a second connection structure connecting the second and third gate electrodes to each other, wherein
the first and second contacts and second connection structure are spaced apart from each other, and
the first and second connection structures intersect each other.

3. The semiconductor device of claim 2, wherein
the first and second connection structures intersect each other in a region between the first and second gate electrodes and between the third and fourth gate electrodes when viewed from the plan view.

4. The semiconductor device of claim 1, wherein at least one of the first and second contacts is in contact with a top surface and a sidewall of one end portion of the first gate electrode or the fourth gate electrode corresponding thereto.

5. The semiconductor device of claim 1, wherein
the first gate electrode is aligned with the third gate electrode in an extending direction of the first and third gate electrodes, and
the second gate electrode is aligned with the fourth gate electrode in an extending direction of the second and fourth gate electrodes when viewed from the plan view.

6. The semiconductor device of claim 1, further comprising:
a first device isolation layer between the PMOSFET region and the NMOSFET region, wherein
a bottom surface of at least one of the first and second contacts is in direct contact with a top surface of the first device isolation layer at the gate cut region.

7. The semiconductor device of claim 1, wherein
the substrate defines active portions in the PMOSFET region and the NMOSFET region,
the first to fourth gate electrodes extend in a first direction parallel to a top surface of the substrate,
the active portions extend in a second direction intersecting the first direction, and
the first to fourth gate electrodes intersect the active portions.

8. The semiconductor device of claim 7, further comprising:
second device isolation layers in the substrate between the active portions, wherein upper portions of the active portions protrude upward above top surfaces of the second device isolation layers.

9. The semiconductor device of claim 1, wherein
the gate cut region includes a first gate cut region and a second gate cut region separated from each other,
the first gate cut region is between the first and third gate electrodes, and
the second gate cut region is between the second and fourth gate electrodes.

10. The semiconductor device of claim 1, wherein a single gate cut region is between the first and third gate electrodes and between the second and fourth gate electrodes.

11. A semiconductor device comprising:
a flip-flop including a PMOSFET region and an NMOSFET region,
the flip flop including a first gate electrode and a second gate electrode on the PMOSFET region;
the flip flop including a third gate electrode and a fourth gate electrode on the NMOSFET region,
the flip flop being configured to apply a scan enable bar signal to the first and fourth gate electrodes,
the flip flop being configured to apply a scan enable signal to the second and third gate electrodes; and
a cross-coupling structure connecting the first and fourth gate electrodes to each other and connecting the second and third gate electrodes to each other,
the cross-coupling structure including a first contact and a second contact connected to the first gate electrode and the fourth gate electrode, respectively;
the cross-coupling structure including a first connection structure that has the first and second contacts and electrically connects the first and fourth gate electrodes to each other,
the cross-coupling structure including a second connection structure that connects the second and third gate electrodes to each other, and
at least one of,
the first contact covers a first sidewall of the first gate electrode and extends along the first sidewall of the first gate electrode in a gate cut region in a thickness direction of the first gate electrode, or
the second contact covers a second sidewall of the fourth gate electrode and extends along the second sidewall of the fourth gate electrode in the gate cut region in a thickness direction of the fourth gate electrode,
the first sidewall faces the third gate electrode, and
the second sidewall faces the second gate electrode.

12. The semiconductor device of claim 11, wherein
the first gate electrode is aligned with the third gate electrode in an extending direction of the first and third gate electrodes, and the second gate electrode is aligned with the fourth gate electrode in an extending direction of the second and fourth gate electrodes when viewed from the plan view.

13. The semiconductor device of claim 11, wherein
the first and third gate electrodes are spaced apart from each other with a first gate cut region in between,
the second and fourth gate electrodes are spaced apart from each other with a second gate cut region in between,
a portion of the first contact overlaps with the first gate cut region when viewed from the plan view, and
a portion of the second contact overlaps with the second gate cut region.

14. The semiconductor device of claim 11, wherein
the first and third gate electrodes are spaced apart from each other with a gate cut region in between,
the gate cut region extends from between the first and third gate electrodes and between the second and fourth gate electrodes, and
a portion of each of the first and second contacts overlaps with the gate cut region when viewed from the plan view.

15. The semiconductor device of claim 11, wherein
the first and second contacts and second connection structure are spaced apart from each other, and
the first and second connection structures intersect each other in a region between the first and fourth gate electrodes and between the second and third gate electrodes.

16. A semiconductor device comprising:
a substrate; and
a logic cell on the substrate,
  the logic cell including first to fourth gate electrodes,
  the first and third gate electrode spaced apart from each other in a first direction,
  the first and third gate electrode extend in the first direction,
  the first and second gate electrode spaced apart from each other in a second direction crossing the first direction,
  the fourth gate electrode being spaced apart from the third gate electrode in the second direction,
  the fourth gate electrode being spaced apart from the second gate electrode in the first direction,
  the first to fourth gate electrodes defining a gate cut region that passes between the first and third gate electrodes and between the second and fourth gate electrodes;
a first contact electrically connected to the first gate electrode and a second contact electrically connected to the fourth gate electrode,
  the first contact extending between the first gate electrode and the third gate electrode, the first contact being spaced apart from the third gate electrode in the first direction,
  the second contact extending between the second gate electrode and the fourth gate electrode, the second contact being spaced apart from the second gate electrode in the first direction, a portion of the first and second contacts overlapping with the gate cut region when viewed from a plan view such that a part of the first contact covers and extends along a sidewall of the first gate electrode in a thickness direction of the first gate electrode in the gate cut region and a part of the second contact covers and extends along a sidewall of the fourth gate electrode in a thickness direction of the fourth gate electrode; and
a first connection line that electrically connects the first gate electrode to the fourth gate electrode, wherein
the first connection line extends in a direction different than the first direction and the second direction from the first gate electrode to the fourth gate electrode, and
the first connection line extends above the first contact and the second contact.

17. The semiconductor device of claim 16, further comprising:
a first connection contact extending in the second direction, wherein
the first connection contact connects the second gate electrode to the third gate electrode,
the first connection contact is spaced apart from the first contact in the first direction and spaced apart from the second contact in the first direction, and
the first connection contact extends between the first contact and the second contact.

18. The semiconductor device of claim 16, further comprising:
a first connection contact extending in the second direction, wherein
the first connection contact connects the second gate electrode to the third gate electrode,
the first connection contact is spaced apart from the first contact in the first direction and spaced apart from the second contact in the first direction,
the first connection contact extends between the first contact and the second contact,
the first connection line extends over the first connection contact, and
the first connection contact is electrically insulated from the first gate electrode, the fourth gate electrode, and the first connection line.

19. The semiconductor device of claim 16, wherein
the substrate includes a PMOSFET region and an NMOSFET region,
the substrate defines a plurality of fins in the PMOSFET region and the NMOSFET region that include sidewalls separated from each other,
the first gate electrode and the second gate electrode cross over the fins in the PMOSFET region, and
the third gate electrode and the fourth gate electrode cross over the fins in the NMOSFET region.

* * * * *